(12) United States Patent
Kugimiya et al.

(10) Patent No.: US 7,683,370 B2
(45) Date of Patent: Mar. 23, 2010

(54) SOURCE/DRAIN ELECTRODES, TRANSISTOR SUBSTRATES AND MANUFACTURE METHODS, THEREOF, AND DISPLAY DEVICES

(75) Inventors: Toshihiro Kugimiya, Kobe (JP); Hiroshi Gotoh, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 11/461,927

(22) Filed: Aug. 2, 2006

(65) Prior Publication Data

US 2007/0040173 A1 Feb. 22, 2007

(30) Foreign Application Priority Data

Aug. 17, 2005 (JP) ............................... 2005-236993

(51) Int. Cl.
*H01L 31/0224* (2006.01)
(52) U.S. Cl. ........................... 257/59; 257/72; 257/350; 257/765; 257/766; 257/E29.117; 257/E29.147; 257/E29.151
(58) Field of Classification Search ................. 438/149, 438/151–152, 158–159, 688, 660, 683; 257/350, 257/765, E29.291, E29.299, 767–768, 771, 257/E29.117, E29.151, 59, 72, 766, E29.147
See application file for complete search history.

(56) References Cited

U.S. PATENT DOCUMENTS

| | | | |
|---|---|---|---|
| 5,514,909 A | 5/1996 | Yamamoto et al. | |
| 6,033,542 A | 3/2000 | Yamamoto et al. | |
| 6,096,438 A | 8/2000 | Takagi et al. | |
| 6,218,206 B1 | 4/2001 | Inoue et al. | |
| 6,252,247 B1 | 6/2001 | Sakata et al. | |
| 2003/0047812 A1 | 3/2003 | Hagihara et al. | |
| 2004/0126608 A1 | 7/2004 | Gotoh et al. | |
| 2005/0072973 A1 | 4/2005 | Kim | |
| 2005/0184395 A1 | 8/2005 | Gotoh et al. | |
| 2005/0224795 A1 | 10/2005 | Gotoh et al. | |
| 2005/0285109 A1 | 12/2005 | Kim | |
| 2006/0007366 A1 | 1/2006 | Gotoh et al. | |
| 2006/0091792 A1 | 5/2006 | Kugimiya et al. | |
| 2007/0278497 A1* | 12/2007 | Kawakami et al. | 257/79 |
| 2008/0081532 A1 | 4/2008 | Okuno | |
| 2008/0121522 A1 | 5/2008 | Ehira et al. | |
| 2008/0223718 A1 | 9/2008 | Takagi et al. | |

FOREIGN PATENT DOCUMENTS

| | | |
|---|---|---|
| EP | 1 878 809 A1 | 1/2008 |
| JP | 59-193062 | 11/1984 |
| JP | 11-283934 | 10/1999 |

(Continued)

OTHER PUBLICATIONS

U.S. Appl. No. 11/461,907, filed Aug. 2, 2006, Kawakami, et al.

(Continued)

*Primary Examiner*—M. Wilczewski
*Assistant Examiner*—Toniae M Thomas
(74) *Attorney, Agent, or Firm*—Oblon, Spivak, McClelland, Maier & Neustadt L.L.P.

(57) ABSTRACT

In a thin-film transistor substrate including a substrate, a thin-film transistor semiconductor layer, a source/drain electrode, and a transparent pixel electrode, the source/drain electrode includes a thin film of an aluminum alloy containing 0.1 to 6 atomic percent of nickel as an alloy element, and the aluminum alloy thin film is directly connected to the thin-film transistor semiconductor layer.

22 Claims, 15 Drawing Sheets

FOREIGN PATENT DOCUMENTS

| | | |
|---|---|---|
| JP | 11-284195 | 10/1999 |
| JP | 11-337976 | 12/1999 |
| JP | 2004-282030 | 10/2004 |
| JP | 2007081385 * | 3/2007 |
| KR | 10-2004-0080895 | 9/2004 |
| KR | 1020040080531 A | 9/2004 |
| KR | 1020040080895 A | 9/2004 |
| KR | 1020060055015 A | 5/2006 |
| TW | 200643186 | 12/2006 |

OTHER PUBLICATIONS

U.S. Appl. No. 11/743,916, filed May 3, 2007, Kawakami, et al.
U.S. Appl. No. 11/431,580, filed May 11, 2006, Toshihiro Kugimiya, et al.
U.S. Appl. No. 11/471,595, filed Jun. 21, 2006, Hiroshi Gotoh, et al.
U.S. Appl. No. 11/349,520, filed Feb. 8, 2006, Hiroshi Gotoh, et al.
U.S. Appl. No. 11/341,531, filed Jan. 30, 2006, Toshihiro Kugimiya, et al.
U.S. Appl. No. 12/126,527, filed May 23, 2008, Hino, et al.
U.S. Appl. No. 12/131,444, filed Jun. 2, 2008, Gotou.
U.S. Appl. No. 12/131,493, filed Jun. 2, 2008, Gotou, et al.
U.S. Appl. No. 12/136,409, filed Jun. 10, 2008, Ochi, et al.
U.S. Appl. No. 12/172,442, filed Jul. 14, 2008, Takagi, et al.
U.S. Appl. No. 12/312,907, filed Jun. 1, 2009, Gotou, et al.
U.S. Appl. No. 12/517,362, filed Jun. 3, 2009, Hino, et al.
U.S. Appl. No. 12/528,008, filed Aug. 20, 2009, Gotou, et al.
U.S. Appl. No. 12/376,863, filed Feb. 9, 2009, Hino, et al.
U.S. Appl. No. 12/355,274, filed Jan. 16, 2009, Kugimiya, et al.
U.S. Appl. No. 12/415,379, filed Mar. 31, 2009, Takagi, et al.
U.S. Appl. No. 12/414,877, filed Mar. 31, 2009, Takagi, et al.

* cited by examiner

F I G . 3
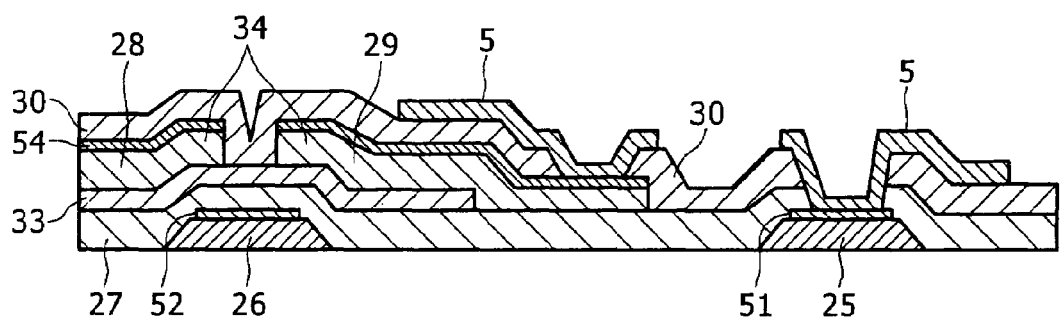

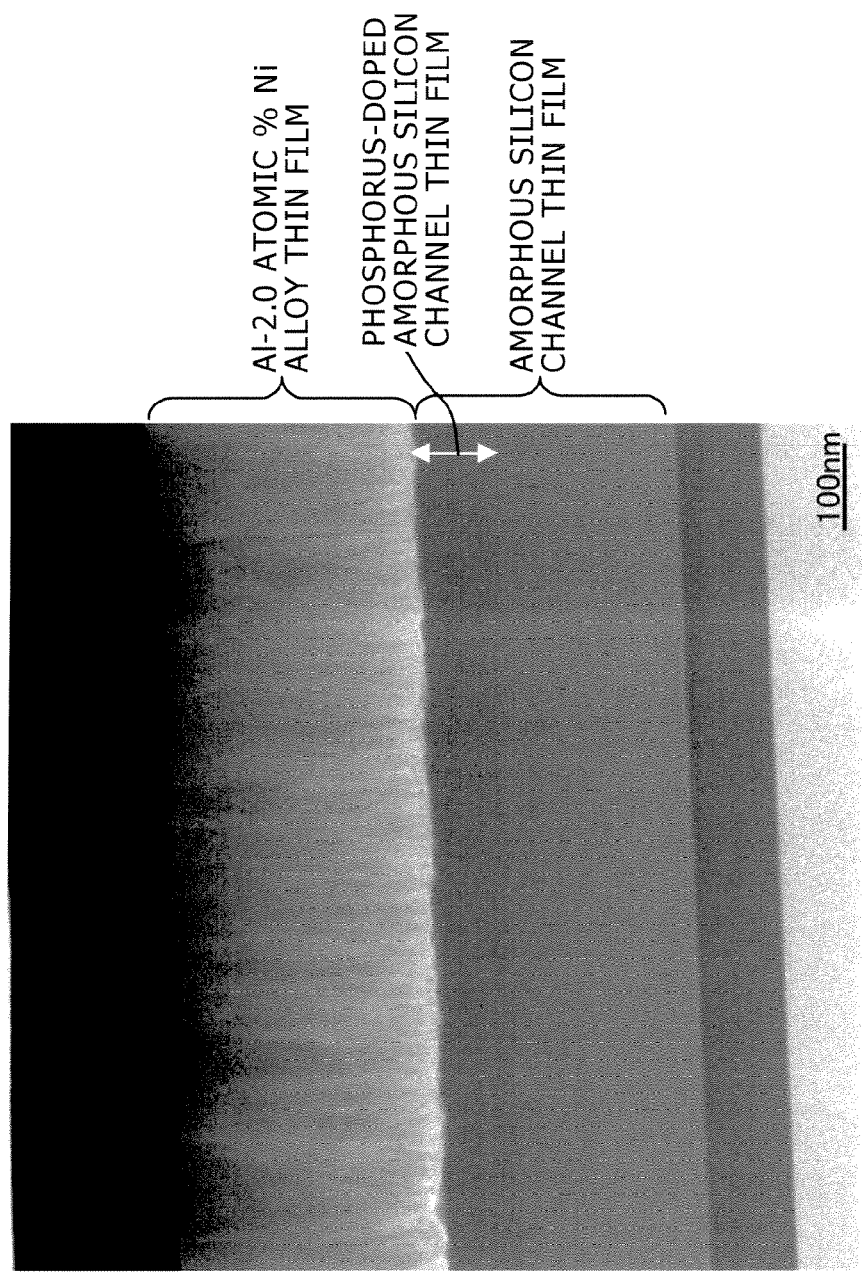

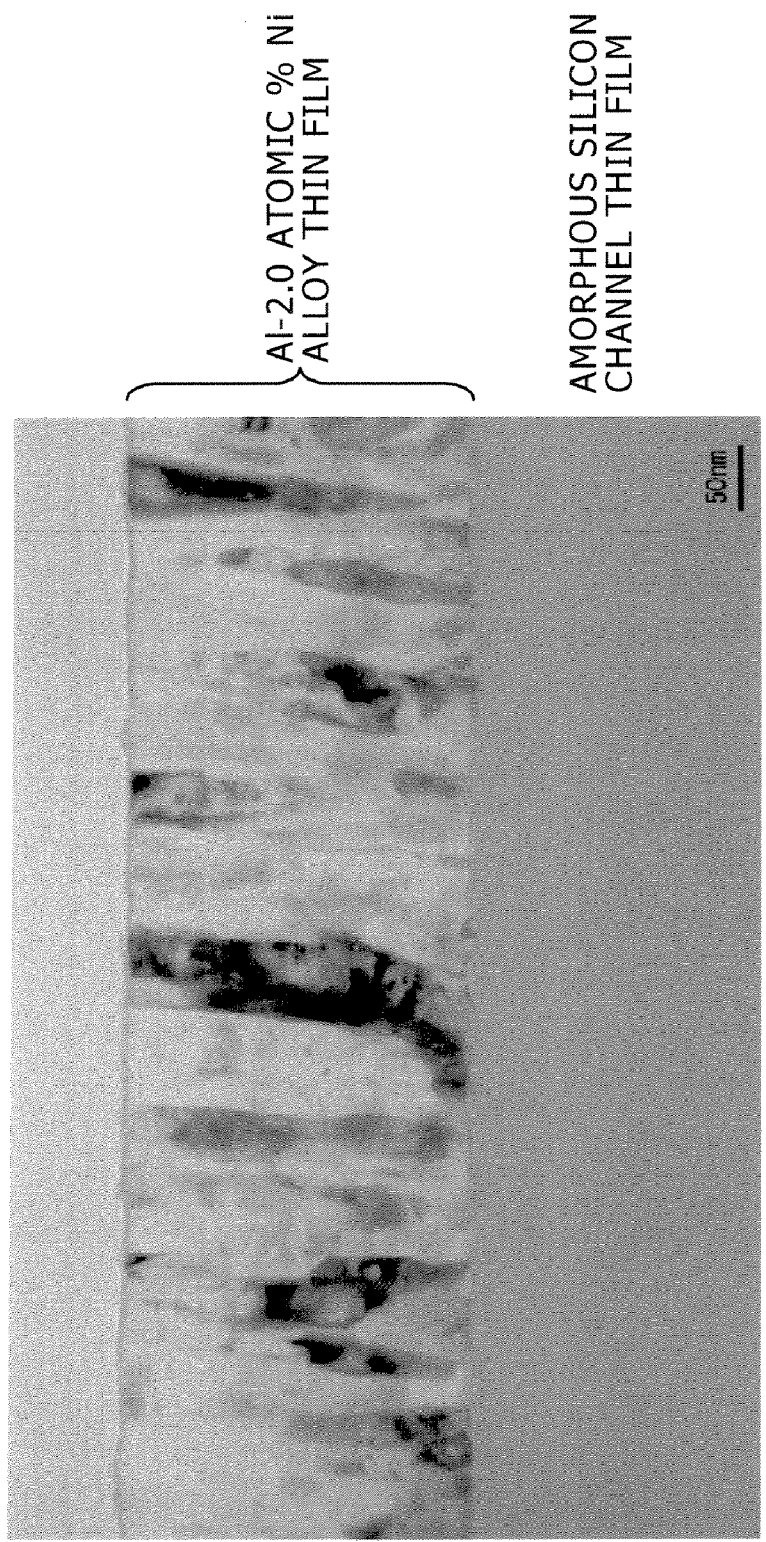

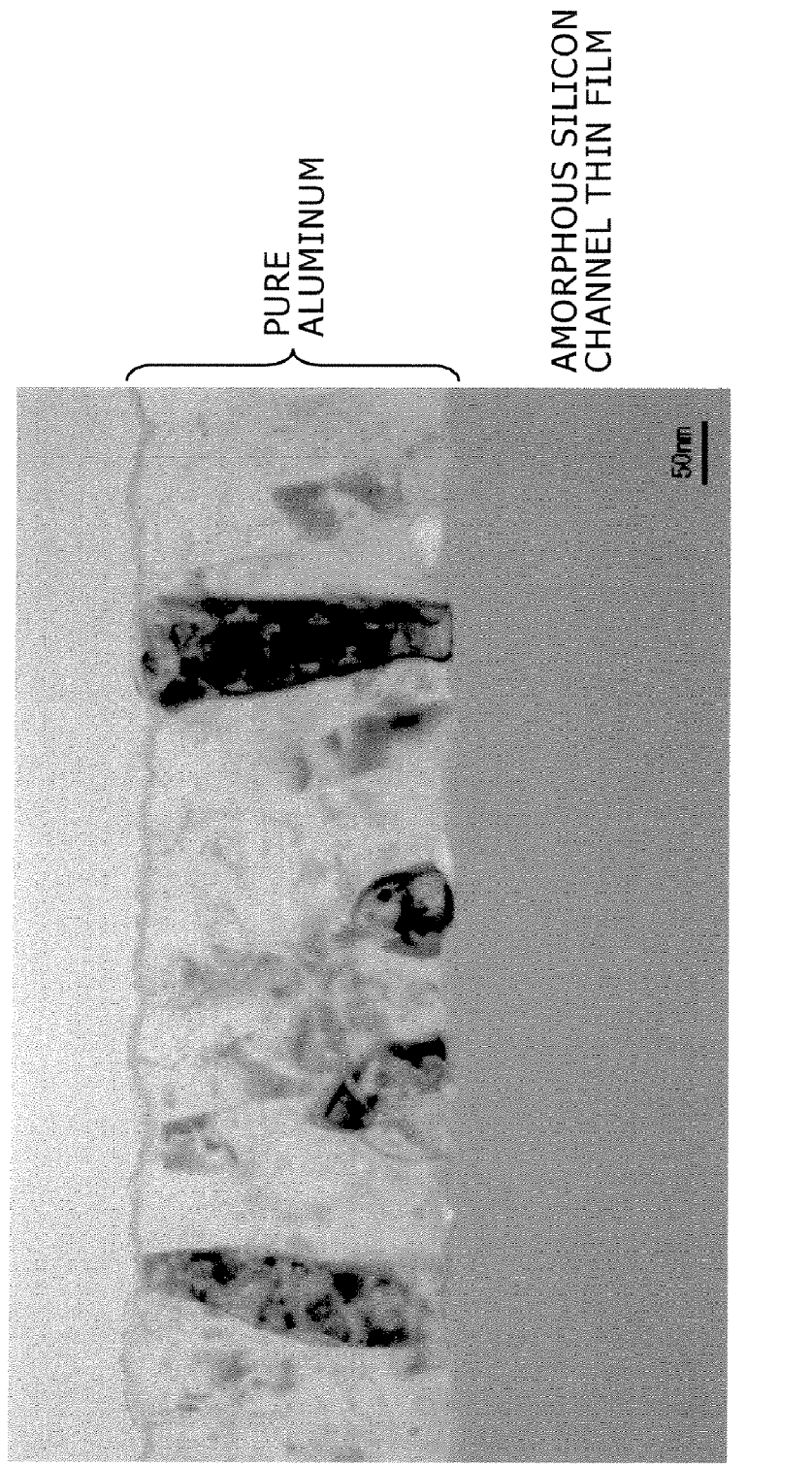

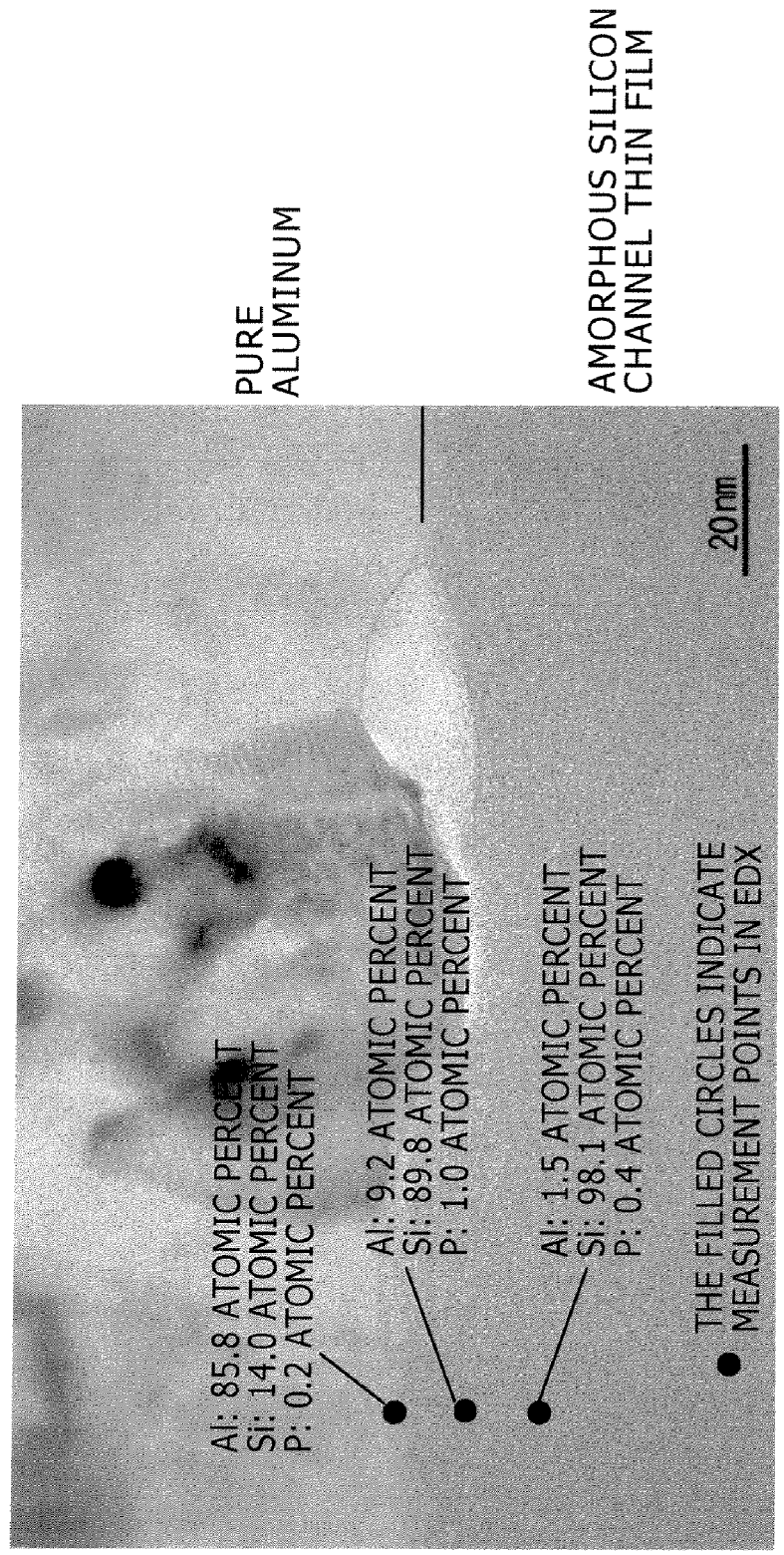

SOURCE/DRAIN ELECTRODES, TRANSISTOR SUBSTRATES AND MANUFACTURE METHODS, THEREOF, AND DISPLAY DEVICES

BACKGROUND OF THE INVENTION

1. Field of the Invention

The present invention relates to source/drain electrodes and transistor substrates for use in thin-film transistors of liquid crystal displays, semiconductor devices, and optical components. It also relates to methods for manufacturing the substrates, and display devices using the substrates. Specifically, it relates to novel source/drain electrodes including an aluminum alloy thin film as a component.

2. Description of the Related Art

Liquid crystal display devices are used in a variety of applications ranging from small-sized mobile phones to large-sized television sets with 30-inch or larger screens. They are categorized by the pixel driving method into passive-matrix liquid crystal display devices and active-matrix liquid crystal display devices. Of these, active-matrix liquid crystal display devices having thin-film transistors (hereinafter briefly referred to as TFTs) as switching devices are widely used, because they realize high-definition images and can produce images at high speed.

With reference to FIG. 1, the configuration and operating principles of a representative liquid crystal display panel for use in active-matrix liquid crystal display devices will be illustrated. A substrate with a TFT array using a hydrogenated amorphous silicon as an active semiconductor layer (hereinafter also referred to as "amorphous silicon thin-film transistor substrate") is taken as an example. The active semiconductor layer, however, is not limited to this, and can also be a polysilicon (polycrystalline silicon) layer.

The liquid crystal display panel 100 in FIG. 1 includes a thin-film transistor substrate 1, a counter substrate 2, and a liquid crystal layer 3. The counter substrate 2 is arranged so as to face the thin-film transistor substrate 1. The liquid crystal layer 3 is arranged between the thin-film transistor substrate 1 and the counter substrate 2 and functions as an optical modulation layer. The thin-film transistor substrate 1 includes an insulative glass substrate 1a, and arranged thereon thin-film transistors 4, a transparent pixel electrode 5, and an interconnection section 6 containing scanning lines and signal lines. The transparent pixel electrode 5 is made typically from an indium tin oxide (ITO) film containing indium oxide ($In_2O_3$) and about 10 percent by mass of tin oxide ($SnO_2$). The thin-film transistor substrate 1 is driven by a driver circuit 13 and a control circuit 14 connected thereto through a tape automated bonding (TAB) tape 12.

The counter substrate 2 includes an insulative glass substrate 1b, and a common electrode 7, a color filter 8, and a light shielding film 9. The common electrode 7 is arranged on the entire surface of the glass substrate 1b facing the thin-film transistor substrate 1. The counter substrate 2 as a whole functions as a counter electrode. The color filter 8 is arranged at such a position as to face the transparent pixel electrode 5. The light shielding film 9 is arranged at such a position as to face the thin-film transistor 4 and the interconnection section 6 on the thin-film transistor substrate 1. The counter substrate 2 further has an alignment layer 11 for aligning liquid crystal molecules (not shown) in the liquid crystal layer 3 to a predetermined direction.

The liquid crystal display panel 100 further includes polarizers 10a and 10b arranged outsides (on sides opposite to the liquid crystal layer 3) of the thin-film transistor substrate 1 and the counter substrate 2, respectively.

In the liquid crystal display panel 100, an electrical field formed between the counter electrode 2 (common electrode 7) and the transparent pixel electrode 5 controls the alignment direction of liquid crystal molecules in the liquid crystal layer 3 to thereby modulate light passing through the liquid crystal layer 3. This controls the quantity of light transmitted through the counter substrate 2 to thereby produce and display an image.

Next, the configuration and operating principles of a conventional amorphous silicon thin-film transistor substrate for use in liquid crystal display panels will be illustrated in detail with reference to FIG. 2. FIG. 2 is an enlarged view of the essential part "A" in FIG. 1.

With reference to FIG. 2, scanning lines (thin-film gate interconnections) 25 are arranged on a glass substrate (not shown). A part of the scanning lines 25 functions as a gate electrode 26 to control (to turn on and off of) the thin-film transistor. A gate insulator (silicon nitride film) 27 is arranged so as to cover the gate electrode 26. Signal lines (source/drain interconnections) 34 are arranged so as to intersect the scanning lines 25 with the gate insulator 27 interposing between them. A part of the signal lines 34 functions as a source electrode 28 of the thin-film transistor. Adjacent to the gate insulator 27 are sequentially arranged an amorphous silicon channel film (active semiconductor film) 33, signal lines (source/drain interconnections) 34, and a silicon nitride interlayer dielectric film (protecting film) 30. A liquid crystal display panel of this type is generally called as a bottom gate type panel.

The amorphous silicon channel film 33 includes a doped layer (n layer) doped with a phosphorus (P), and an intrinsic layer (i layer; also called as an undoped layer). On the gate insulator 27 is a pixel region, in which the transparent pixel electrode 5 is arranged. The transparent pixel electrode 5 is made from, for example, an ITO film containing $In_2O_3$ and SnO. A drain electrode 29 of the thin-film transistor is in contact with and electrically connected to the transparent pixel electrode 5 with the interposition of an after-mentioned barrier metal layer.

When a gate voltage is applied to the gate electrode 26 through the scanning line 25, the thin-film transistor 4 is turned on. In this state, a drive voltage which has been applied to the signal line 34 is applied from the source electrode 28 through the drain electrode 29 to the transparent pixel electrode 5. When the transparent pixel electrode 5 is applied with the drive voltage at a predetermined level, a potential difference occurs between the transparent pixel electrode 5 and the counter electrode 2, as described above with reference to FIG. 1. This potential difference orients or aligns the liquid crystal molecules in the liquid crystal layer 3, thereby bringing about light modulation.

In the thin-film transistor substrate 1, the source/drain interconnections 34 electrically connected to the source/drain electrodes; signal lines electrically connected to the transparent pixel electrode 5 (signal lines for pixel electrode); and scanning lines 25 electrically connected to the gate electrode 26 are each made from a thin film of pure alloy or an aluminum alloy such as Al—Nd (hereinafter pure aluminum and aluminum alloys are generically referred to as "aluminum alloys"). This is because such pure aluminum or aluminum alloys have a low resistivity and can be easily processed. Barrier metal layers 51, 52, 53, and 54 containing a refractory metal such as Mo, Cr, Ti, or W are arranged on and under these interconnections, as illustrated in FIG. 2.

Reasons why the conventional aluminum alloy thin films must be connected to the other components with the interposition of barrier metal layers will be described below. The aluminum alloy thin film is connected to the transparent pixel electrode 5 with the interposition of the barrier metal layers 51 and 52 as illustrated in FIG. 2. This is because, if an aluminum alloy thin film is directly connected to the transparent pixel electrode, the contact resistance between these components is high, which impairs the quality of displayed images. Aluminum used as a material for the interconnections for the transparent pixel electrode is very susceptible to oxidation, and an insulating layer of an aluminum oxide is formed at the interface between the aluminum alloy thin film and the transparent pixel electrode. The aluminum oxide is derived from oxygen formed or added during film-deposition processes of the liquid crystal display panel. The indium tin oxide (ITO) as a material for the transparent pixel electrode is an electrically conductive metal oxide, but it fails to establish an electrically Ohmic contact if the aluminum oxide layer is formed.

The deposition of such barrier metal layers, however, requires extra film-deposition chambers for the deposition thereof, in addition to sputtering systems for the deposition of the gate electrode, source electrode, and drain electrode. These extra units cause an increased production cost and a decreased productivity.

Accordingly, proposals on materials for electrodes that eliminate the necessity for barrier metal layers and enable direct contact between source/drain electrodes and a transparent pixel electrode have been made.

Japanese Unexamined Patent Application Publication (JP-A) No. Hei 11-337976 discloses a technique of using an indium zinc oxide (IZO) film containing indium oxide and about 10 percent by mass of zinc oxide as the material for the transparent pixel electrode. According to this technique, however, the ITO film that is most widely used must be replaced with the IZO film, which causes an increased material cost.

JP-A No. Hei 11-283934 discloses a method of modifying the surface of a drain electrode by subjecting the drain electrode to plasma treatment or ion implantation. The method, however, requires an extra step for the surface treatment, which causes a decreased productivity.

JP-A No. Hei 11-284195 discloses a method of constructing the gate electrode, source electrode, and drain electrode from a first layer of pure aluminum or an aluminum alloy, and a second layer of pure aluminum or an aluminum alloy further containing impurities such as nitrogen, oxygen, silicon, and carbon. This method is advantageous in that thin films for constituting the gate electrode, source electrode, and drain electrode can be continuously deposited in one film-deposition chamber. This method, however, requires an extra step of depositing the second layer containing impurities. In addition, the resulting source/drain interconnections frequently delaminate as flakes from the wall of the chamber in the step of introducing impurities into the source/drain interconnections. This is caused by a difference in thermal expansion coefficient between a film containing the impurities and a film not containing the impurities. To avoid this problem, the method requires frequent maintenance operations while stopping the film-deposition step, and this results in a significantly decreased productivity.

Under these circumstances, the present inventors have disclosed a method that eliminates the necessity for barrier metal layers, simplifies the manufacturing process without increasing the number of steps, and enables direct and reliable contact between the aluminum alloy film and the transparent pixel electrode in JP-A No. 2004-214606. The technique disclosed in JP-A No. 2004-214606 uses an aluminum alloy containing 0.1 to 6 atomic percent of at least one selected from the group consisting of Au, Ag, Zn, Cu, Ni, Sr, Ge, Sm, and Bi as an alloy element, and allowing at least one of these alloy elements to be a precipitated or enriched layer at the interface between the aluminum alloy film and the transparent pixel electrode to thereby achieve the object.

As is described above, the technique disclosed in JP-A No. 2004-214606 permits the direct connection between the aluminum alloy film and the transparent pixel electrode.

However, no technique has been disclosed that enables the direct contact between an amorphous silicon thin film and a source/drain interconnection containing an aluminum alloy.

As is described above, conventional interconnections as source/drain interconnections include an aluminum alloy thin film and barrier metal layers 54 and 53 arranged on and under the aluminum alloy thin film, respectively. A representative example of such an interconnection is a multilayer (three-layer) interconnection including a molybdenum (Mo) layer (lower barrier metal layer) about 50 nm thick, a pure aluminum or Al—Nd alloy thin film about 150 nm thick, and a Mo layer (upper barrier metal layer) about 50 nm thick arranged in this order. The lower barrier metal layer is arranged mainly so as to prevent interdiffusion between silicon and aluminum at the interface between the aluminum alloy thin film and the amorphous silicon thin film. The upper barrier metal layer is arranged mainly so as to prevent hillocks (nodular projections) on the surface of the aluminum alloy thin film. These mechanisms will be described in detail later.

The formation of upper and lower barrier metal layers, however, requires an extra film-deposition system for the deposition thereof, in addition to a film-deposition system for the deposition of aluminum alloy interconnections. Specifically, a film-deposition system including extra film-deposition chambers for the deposition of respective barrier metal thin films must be used. A representative example of the system is a cluster tool system including multiple film-deposition chambers connected to a transfer chamber. The system including extra units for the deposition of barrier metal layers causes an increased production cost and a reduced productivity.

In addition, the tapering of the three-layered multilayer interconnection by wet etching requires different etchants (etching solutions) for the barrier metals and for the aluminum alloy, respectively, and further requires different etching baths suitable for the etchants, to thereby cause an increased cost. An attempt has been made to carry out tapering of the multilayer interconnection using one etchant, for example, by constructing the upper barrier metal layer from pure molybdenum and the lower barrier metal layer from a molybdenum alloy. However, this technique does not realize processing with high precision.

Accordingly, strong demands have been made to provide source/drain electrodes that eliminate the need of the upper and lower barrier metal layers and permit direct connection between the amorphous silicon thin film and an aluminum alloy thin film for source/drain interconnections.

The manufacture of display devices have been conducted at lower and lower temperatures in order to improve the yield and productivity. Source/drain electrode materials for amorphous silicon thin-film transistors, for example, must have a low electrical resistivity of about 8 $\mu\Omega \cdot cm$ or lower and a high thermal stability in terms of allowable temperature limit of about 350° C. The allowable temperature limit is determined according to the highest temperature applied upon the source/drain electrodes during manufacturing processes of thin-film transistor substrates. The highest temperature herein is generally the temperature at which a dielectric film as a protecting film is deposited on the electrodes. Recent advances in film-deposition technologies realize the deposition of desired dielectric films even at relatively low temperatures. In particular, they realize the deposition of such a protecting film on source/drain electrodes at about 200° C.

The source/drain electrode materials must therefore have an allowable temperature limit of around 200° C. and a sufficiently low electrical resistivity.

The above explanation has been made by taking a liquid crystal display device as a representative example, but the problems in the conventional techniques are in common in amorphous silicon thin-film transistor substrates used not only in liquid crystal display devices but also in other devices.

SUMMARY OF THE INVENTION

The present invention has been accomplished under these circumstances, and an object of the present invention is to provide an source/drain electrode that eliminates the need of the lower barrier metal layer, simplifies the manufacturing processes without increasing the number of steps, permits the direct and reliable connection between an aluminum alloy film and the amorphous silicon channel film, and ensures a low electrical resistivity even when the aluminum alloy film is subjected to a process at low temperatures of about 100° C. or higher and about 300° C. or lower. Specifically, the object is to provide a source/drain electrode that is suitable for processes at lower temperatures and reliably ensures a low electrical resistivity of the aluminum alloy film of 8 $\mu\Omega$·cm or lower even when the aluminum alloy film is subjected to a heat treatment at low temperatures of, for example, about 200° C. for about twenty minutes.

Another object of the present invention is to provide a technique of eliminating the need of not only the lower barrier metal layer but also the upper barrier metal layer to thereby permit the direct and reliable connection of the aluminum alloy film not only to the amorphous silicon channel film but also to the transparent pixel electrode.

Specifically, the present invention provides a source/drain electrode for use in a thin-film transistor substrate including a substrate, a thin-film transistor semiconductor layer, source/drain electrodes, and a transparent pixel electrode, the source/drain electrode including a thin film of an aluminum alloy containing 0.1 to 6 atomic percent of nickel as an alloy element, in which the source/drain electrode is so configured that the aluminum alloy thin film is directly connected to the thin-film transistor semiconductor layer.

The aluminum alloy preferably further contains 0.1 to 1.0 atomic percent of at least one element selected from the group consisting of Ti, V, Zr, Nb, Mo, Hf, Ta, and W as an alloy element.

Alternatively or in addition, the aluminum alloy can further contain 0.1 to 2.0 atomic percent of at least one element selected from the group consisting of Mg, Cr, Mn, Ru, Rh, Pd, Ir, Pt, La, Ce, Pr, Gd, Tb, Dy, Nd, Y, Co, and Fe as an alloy element.

In a preferred embodiment, a nickel-containing compound is contained at the interface between the aluminum alloy thin film and the thin-film transistor semiconductor layer.

The nickel-containing compound is preferably at least one compound selected from the group consisting of an intermetallic compound of aluminum with nickel both contained in the aluminum alloy; a silicide or silicon compound of nickel contained in the aluminum alloy with silicon contained in the thin-film transistor semiconductor layer; and an intermetallic compound of aluminum and nickel in the aluminum alloy with silicon in the thin-film transistor semiconductor layer.

In another preferred embodiment, a nickel-enriched layer is contained at the interface between the aluminum alloy thin film and the thin-film transistor semiconductor layer, in which the nickel-enriched layer has an average nickel concentration 2 times or more higher than the average nickel concentration of the aluminum alloy.

The aluminum alloy thin film preferably has an electrical resistivity of 8 $\mu\Omega$·cm or lower.

The aluminum alloy thin film is preferably so configured as to be further directly connected to the transparent pixel electrode.

In yet another preferred embodiment, AlOx is contained at the interface between the aluminum alloy thin film and the transparent pixel electrode, wherein "x" is the atomic ratio of oxygen and satisfies the following condition: $0 < x \leq 0.8$.

In still another preferred embodiment, a nickel-enriched layer is contained at the interface between the aluminum alloy thin film and the transparent pixel electrode, in which the nickel-enriched layer has an average nickel concentration 2 times or more higher than the average nickel concentration of the aluminum alloy.

The transparent pixel electrode preferably contains an indium-tin-oxide (ITO) or an indium zinc oxide (IZO).

The present invention further provides a thin-film transistor substrate including any of these source/drain electrodes.

The present invention further provides a display device including the thin-film transistor substrate.

In addition and advantageously, the present invention provides method for manufacturing the thin-film transistor substrate, including the steps of (a) preparing a substrate bearing a thin-film transistor semiconductor layer; (b) depositing the aluminum alloy thin film on the thin-film transistor semiconductor layer; and (c) depositing a silicon nitride film on the aluminum alloy thin film, in which the step (c) includes the step of carrying out heating at temperatures of 10° C. or higher and 300° C. or lower. The step (b) preferably includes a sputtering process.

The source/drain electrodes according to the present invention have the above-mentioned configurations, thereby permit direct connection between the aluminum alloy thin film and the thin-film transistor semiconductor layer. In preferred embodiments, they further permit the direct connection between the aluminum alloy thin film and the transparent pixel electrode. They can therefore provide inexpensive, high-performance display devices with excellent productivity.

The source/drain electrodes according to the present invention further ensure a sufficiently low electrical resistivity even when heat treatment is carried out at relatively low temperatures of about 200° C. The term "heat treatment temperature" herein refers to the highest temperature during manufacturing processes of TFT array substrates. It corresponds to, for example, the temperature of heating the substrate in CVD film-deposition or the temperature of a heating furnace for thermosetting of the protecting film, in general manufacturing processes of thin-film transistor substrates for display devices.

Further objects, features and advantages of the present invention will become apparent from the following description of the preferred embodiments with reference to the attached drawings.

BRIEF DESCRIPTION OF THE DRAWINGS

FIG. 3 is a schematic sectional view illustrating the configuration of a thin-film transistor substrate according to First Embodiment of the present invention;

FIG. 5B is a high-angle annular dark-field scanning transmission electron micrograph (HAADF-STEM) of the interface taken under the same condition as in FIG. 5A;

FIG. 6A is a cross-sectional transmission electron micrograph (cross-sectional TEM) of the interface between the Al—Ni alloy thin film and the amorphous silicon thin film of the thin-film transistor substrate according to First Embodiment of the present invention after the completion of the manufacture;

FIG. 8A is across-sectional transmission electron micrograph of the interface between a pure aluminum thin film and an amorphous silicon thin film immediately after the deposition of the pure aluminum thin film on the amorphous silicon thin film at room temperature according to Comparative Example 1;

FIG. 8B is a high-angle annular dark-field scanning transmission electron micrograph (HAADF-STEM) of the interface taken under the same condition as in FIG. 8A;

DESCRIPTION OF THE PREFERRED EMBODIMENTS

Figure 1:
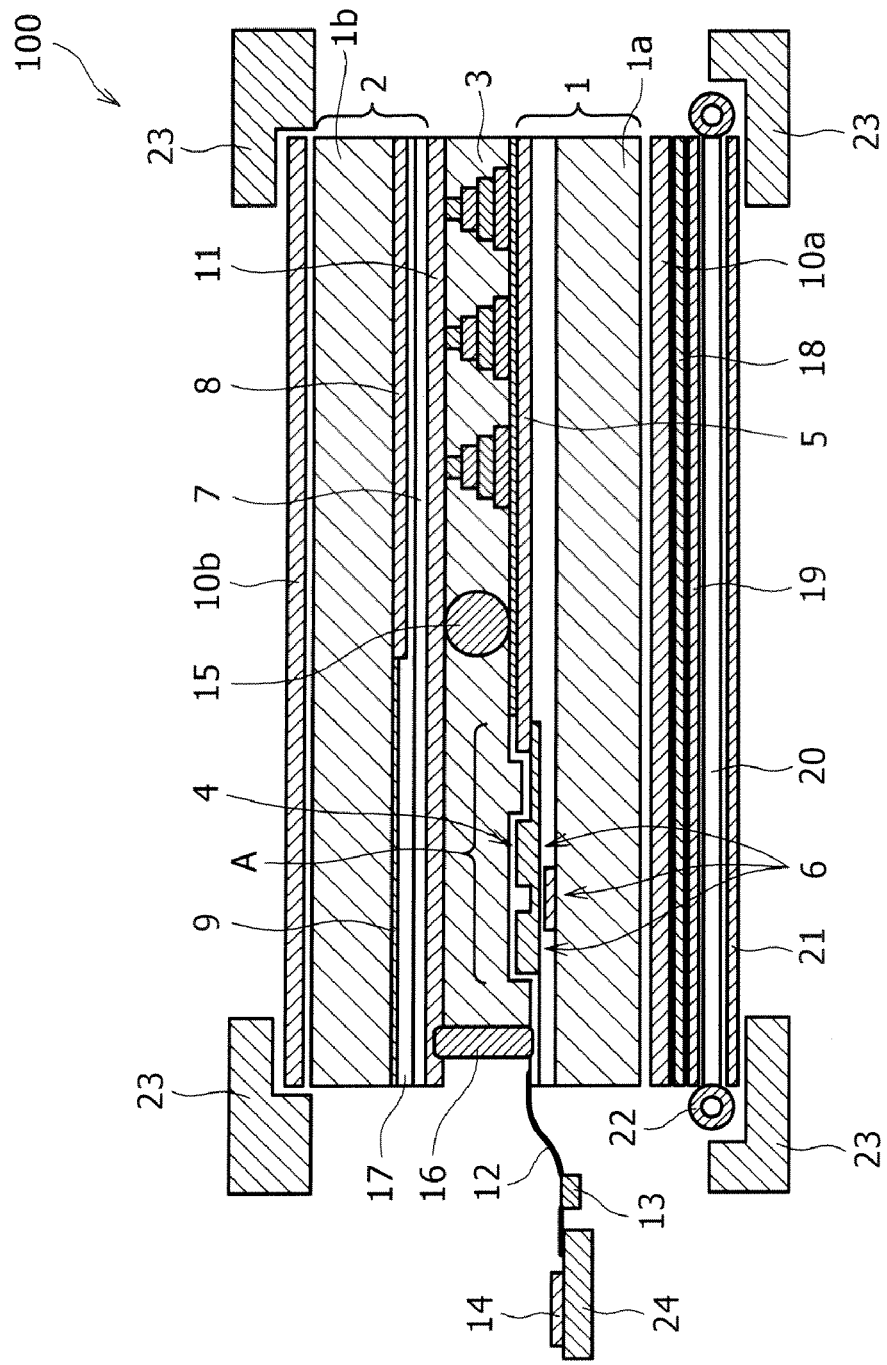
FIG. 1 is a schematic enlarged sectional view illustrating the configuration of a representative liquid crystal display panel to which an amorphous silicon thin-film transistor substrate is applied.

The present inventors made intensive investigations to provide a novel technique for the direct and reliable connection between a thin-film transistor semiconductor layer and an aluminum alloy thin film for source/drain electrodes. As a result, they have found that the interdiffusion between aluminum and silicon at the interface between the aluminum alloy thin film and the thin-film transistor semiconductor layer can be prevented and the objects can be achieved by using an aluminum alloy containing 0.1 to 6 atomic percent of nickel as the aluminum alloy for the source/drain electrodes. The present invention has been achieved based on these findings. The present invention eliminates the need of not only the lower barrier metal layer but also the upper barrier metal layer, thereby permits the direct connection of the Al—Ni alloy thin film not only to the thin-film transistor semiconductor layer but also to the transparent pixel electrode.

The term "source/drain electrode" used herein means and includes both a source/drain electrode itself and a source/drain interconnection. Specifically, the source/drain electrodes according to the present invention each comprise a source/drain electrode integrated with a source/drain interconnection, in which the source/drain interconnection is in contact with a source/drain region.

Before the detailed description of the configuration of the present invention, the circumstances that lead the present inventors to the present invention will be illustrated, with reference to the technique disclosed in JP-A No. 2004-214606.

Specifically, the present inventors made intensive investigations to improve the properties and productivity of interconnection materials for use in liquid crystal display devices.

Initially, the present inventors focused attention on interconnections for the transparent pixel electrode, and developed an alloy thin film comprising trace amounts of, for example, a noble metal such as Au or Ag as an alloy element, as an aluminum alloy that can be directly connected to the transparent pixel electrode (above-mentioned JP-A No. 2004-214606). By using the aluminum alloy disclosed in JP-A No. 2004-214606, the formation of an insulative layer of aluminum oxide at the interface can be prevented, in contrast to conventional equivalents. This is because an electrically conductive precipitate is formed at the interface between the aluminum alloy thin film and the transparent pixel electrode, and most of contact current passes through the precipitate.

Next, the present inventors focused attention on source/drain interconnections and made further investigations to provide an aluminum alloy that permits direct connection to the thin-film transistor semiconductor layer without the interposition of barrier metal layers typically of molybdenum, in contrast to conventional equivalents. To achieve this object, interdiffusion between silicon and aluminum at the interface between the aluminum alloy thin film for source/drain interconnections and the thin-film transistor semiconductor layer must be prevented, differing from the technique disclosed in JP-A No. 2004-214606. From this viewpoint, the present inventors made much experiments and have found that, of various elements that can be incorporated into aluminum alloy, nickel (Ni) effectively prevents the interdiffusion between silicon and aluminum. The present invention has been achieved based on these findings. In this connection, the mechanism of the interdiffusion will be described in detail below.

Hereinbelow, the interdiffusion between silicon and aluminum at the interface between the aluminum alloy thin film and the thin-film transistor semiconductor layer (herein after also simply referred to as "interface") will be described.

The lower barrier metal layer made typically of molybdenum is conventionally arranged under an aluminum alloy thin film to be connected to the thin-film transistor semiconductor layer. This is mainly because silicon at the interface diffuses into the aluminum alloy thin film as a result of heat treatment during deposition of the thin-film transistor, and this increases the electrical resistance of the aluminum alloy thin film. Specifically, silicon diffused into the aluminum alloy thin film forms precipitated silicon grains, and they grow as a solid phase to form insulative silicon islands to thereby increase the electrical resistance of the source/drain electrode.

Aluminum also diffuses into the thin-film transistor semiconductor layer at the interface concurrently with the diffusion of silicon. The aluminum diffused into the thin-film transistor semiconductor layer acts to compensate the carrier of phosphorus doped into the semiconductor layer, which increases the contact resistance at the interface.

The aluminum diffused into the thin-film transistor semiconductor layer further diffuses into a depletion layer of silicon (a region where the charge stands at zero) to form a defect level, causing an abnormal current passing through the semiconductor layer. This causes an increased leak current passing when the thin-film transistor is turned off (OFF-state current), and the switching function cannot be achieved. In addition, the thin-film transistor consumes a larger power when it is turned off.

Consequently, the requirements in properties of alloy elements to be added to aluminum in the present invention differ from those in the technique disclosed in above-mentioned JP-A No. 2004-214606. Specifically, the technique disclosed in JP-A No. 2004-214606 uses an aluminum alloy as an interconnection material to be directly connected to the transparent pixel electrode and specifies the elements to be added to the aluminum alloy, from the viewpoint of preventing oxidation of aluminum at the interface between the aluminum alloy thin film and the transparent pixel electrode. In contrast, the present invention uses an aluminum alloy as a source/drain interconnection material to be directly connected to the thin-film transistor semiconductor layer and specifies elements to be added to the aluminum alloy, from the viewpoint of preventing the diffusion of silicon at the interface between the aluminum alloy thin film and the semiconductor layer. The two techniques differ in requirements of properties of the interconnection material.

Next, Al—Ni alloys for use in the present invention will be illustrated.

An aluminum alloy comprising 0.1 to 6 atomic percent of nickel is used as a source/drain electrode in the present invention, as is described above. By satisfying this, a nickel-containing precipitate or a nickel-enriched layer can be formed at the contact interface between the Al—Ni alloy and the thin-film transistor semiconductor layer as a result of heat treatment at relatively low temperatures. The precipitate and nickel-enriched layer act to prevent the diffusion of silicon and aluminum at the interface to thereby reduce the OFF-state current (see after-mentioned Experimental Examples).

The "nickel-containing precipitate" herein means at least one compound selected from the group consisting of an intermetallic compound of aluminum with nickel both contained in the aluminum alloy; a silicide or silicon compound of nickel in the aluminum alloy with silicon in the thin-film transistor semiconductor layer; and an intermetallic compound of aluminum and nickel in the aluminum alloy with silicon in the thin-film transistor semiconductor layer.

The "nickel-enriched layer" means a layer being located at the interface between the Al—Ni alloy thin film and the thin-film transistor semiconductor layer and having an average nickel concentration 2 times or more (preferably 2.5 times or more) higher than the average nickel concentration of the Al—Ni alloy. The nickel-enriched layer has a thickness of preferably 0.5 nm or more and 10 nm or less, and more preferably 1.0 nm or more and 5 nm or less.

If the nickel content is less than 0.1 atomic percent, the diffusion of silicon and aluminum at the interface between the Al—Ni alloy and the amorphous silicon thin film (semiconductor layer) cannot be effectively prevented, as demonstrated in after-mentioned Experimental Examples. In contrast, if it exceeds 6 atomic percent, the Al—Ni alloy thin film may have an excessively high electrical resistance. Thus, the response speed of pixel decreases, the power consumption increases, and the resulting display has impaired quality not suitable for practical use. The range of the nickel content herein is set in consideration of these advantages and disadvantages. The nickel content is preferably 0.5 atomic percent or more and 5 atomic percent or less.

The Al—Ni alloy for use in the present invention preferably further comprises 0.1 to 1.0 atomic percent of at least one element selected from the group consisting of Ti, V, Zr, Nb, Mo, Hf, Ta, and W (hereinafter the group is also referred to as "Group α") as an alloy element. The Al—Ni alloy containing at least one element belonging to Group α (hereinafter also referred to as "Al—Ni-α alloy") further effectively prevents the interdiffusion between silicon and aluminum and effectively prevents the formation of hillocks (nodular projections) on the surface of the aluminum alloy thin film. If the content of the at least one element belonging to Group α is less than 0.1 atomic percent, the activity of these elements may not be effectively exhibited. In contrast, if it exceeds 1.0 atomic percent, the activity may increase but the Al—Ni-α alloy thin film may have an increased electrical resistivity with respect to the film material. In consideration of these, the content of the at least one element belonging to Group α is more preferably 0.2 atomic percent or more and 0.8 atomic percent or less. Each of these elements can be used alone or in combination. When they are used in combination, the total content of the elements should fall within the above-specified range.

Alternatively or in addition, the Al—Ni alloy for use in the present invention preferably further comprises 0.1 to 2.0 atomic percent of at least one element selected from the group consisting of Mg, Cr, Mn, Ru, Rh, Pd, Ir, Pt, La, Gd, Tb, Dy, Nd, Y, Co, Ce, Pr, and Fe (hereinafter this group is also referred to as "Group β"). The Al—Ni alloy containing at least one element belonging to Group β (hereinafter also referred to as "Al—Ni-β alloy") further effectively prevents the interdiffusion between silicon and aluminum and effectively prevents the formation of hillocks (nodular projections) on the surface of the aluminum alloy thin film. If the content of the at least one element belonging to Group β is less than 0.1 atomic percent, the activity may not be effectively exhibited. However, if it exceeds 2.0 atomic percent, the resistivity of the Al—Ni-β alloy thin film may increase, although the activity may increase. In consideration of these, the content of the at least one element belonging to Group β is more preferably 0.3 atomic percent or more and 1.8 atomic percent or less. Each of these elements can be used alone or in combination. When they are used in combination, the total content of the elements should fall within the above-specified range.

The Al—Ni alloy for use in the present invention can be an Al—Ni-α-β alloy comprising both of at least one element belonging to Group α and at least one element belonging to Group α.

The mechanism of hillock formation will be described below.

Hillocks are probably formed in the following manner. A heat treatment generally at about 300° C. to about 400° C. is carried out in the deposition of a silicon nitride film (protecting film) after the deposition of the thin film of pure aluminum or aluminum alloy in manufacturing processes of the thin-film transistor substrate. Specifically, the substrate coated with the aluminum alloy thin film is subjected typically to chemical vapor deposition (CVD) to thereby deposit a silicon nitride film (protecting film). The hillocks are probably caused by a difference in thermal expansion between the aluminum alloy thin film and the glass substrate during this heat treatment.

These elements belonging to Groups α and β are selected from the viewpoints of increasing the thermal stability and reducing the electrical resistivity of the resulting Al—Ni-β alloy thin film or Al—Ni-β alloy thin film. Groups α and β slightly differ from each other in the mechanism to contribute to thermal stability. This will be illustrated in detail below, with reference to FIG. 12.

Figure 12:
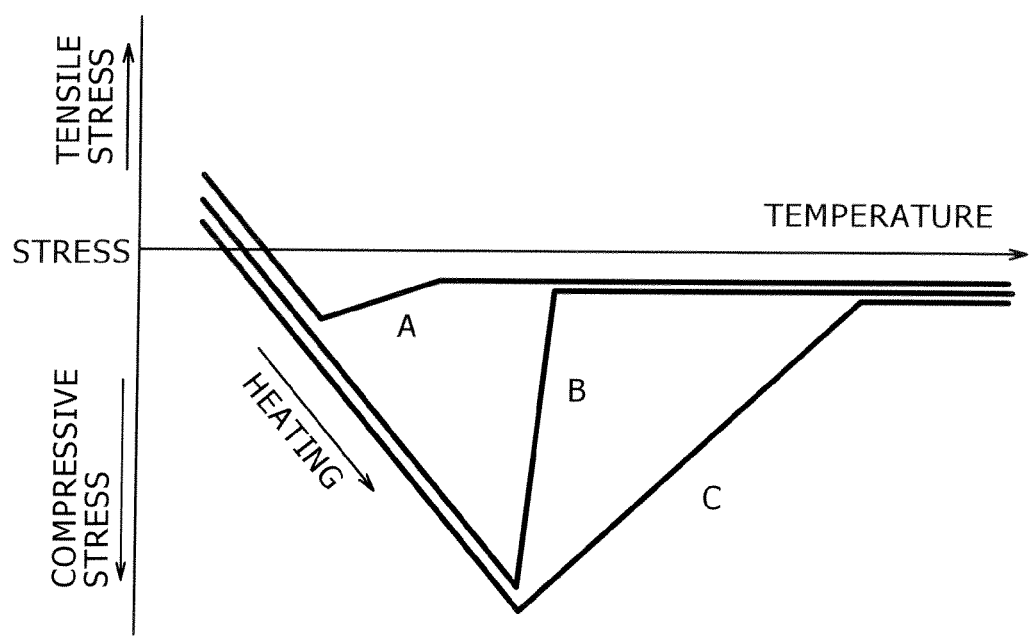
FIG. 12 is diagram showing how the stress varies depending on the deposition temperature of the aluminum alloy film.

FIG. 12 is a diagram schematically illustrating how the stress of aluminum thin film varies depending on its temperature. The symbols "A", "B", and "C" in FIG. 12 represent the data of pure aluminum, an Al-β alloy comprising an element belonging to Group β, and an Al-α alloy comprising an element belonging to Group α, respectively.

FIG. 12 shows that the Al-β alloy film "B" comprising an element belonging to Group β has an increasing compressive stress with an elevating temperature. The grain growth is inhibited in early stages of temperature elevation but it initiates at relatively low temperatures, and the stress is sharply relaxed in a narrow range of temperatures. This is probably because a dissolved element contained in the alloy precipitates as an intermetallic compound, and this accelerates the grain growth of aluminum to thereby reduce the electrical resistivity. Specifically, the electrical resistivity is sufficiently reduced at relatively low heating temperatures. However, when the thin film is further heated in the state where the stress is fully relaxed, compressive stress occurs in the thin film, and this extrudes crystal grains and thereby causes, for example, hillocks. The alloy probably has an allowable temperature limit near to the temperature at which the stress is relaxed.

The Al-α alloy film "C" comprising an element belonging to Group α shows an increasing compressive stress with an elevating temperature as in the Al-β alloy film "B", and the grain growth of aluminum initiates at similar temperatures to those in the Al-β alloy film. However, the element belonging to Group α diffuses from the solid-solution and precipitates as an intermetallic compound relatively slowly. Thus, the intermetallic compound gradually precipitates over a wide range of temperatures, and the stress is gradually relaxed along with the precipitation, as illustrated in FIG. 12. Therefore, it requires much heating and quite a long time before the stress is sufficiently relaxed, most of the dissolved element precipitates as an intermetallic compound, and the grain growth of aluminum proceeds to allow the film matrix to have a sufficiently reduced electrical conductivity. This results in increased thermal stability. Specifically, the elements belonging to Group α may more slowly precipitate as an intermetallic compound, thereby more effectively increase the thermal stability, and can exhibit sufficient advantage of improving the thermal stability in a smaller amount than the elements belonging to Group β.

Thus, the elements belonging to Group α and those belonging to Group β differ in mechanism of exhibiting the thermal stability and thereby differ in content (upper limit of the content).

The elements belonging to Group α can reduce the contact resistivity to a target level in a smaller amount than the elements belonging to Group β, as demonstrated in after-mentioned Experimental Examples. This activity is also observed when the thin film is heated at relatively low temperatures.

In addition, the elements belonging to Group α are resistant to the formation of voids in the electrode film as compared with the elements belonging to Group β, although the content of the former should be set lower than the content of the latter. Specifically, when an element that rapidly precipitates as an intermetallic compound in a narrow range of temperatures upon heating, such as one belonging to Group β, is used, amore intensive tensile stress occurs in the film with proceeding grain growth, when the film is cooled to room temperature after heating. The tensile stress may cause voids. In contrast, in an alloy system in which an intermetallic compound gradually precipitates over a long time with an elevating temperature, such as an element belonging to Group α, the precipitation and grain growth are interrupted when the alloy is heated to temperatures as in Group β, the stress is not sufficiently relaxed, and a small quantity of the tensile stress remains in the film when cooled to room temperature. Thus, when emphasis is laid on the prevention of voids caused by the tensile stress, the elements belonging to Group α are preferably used.

These Al—Ni alloy thin films are preferably deposited by vapor deposition or sputtering, and are more preferably deposited by sputtering.

The Al—Ni alloy thin film for source/drain interconnection is preferably directly connected to the transparent pixel electrode, and the thin-film transistor substrate having this configuration is also included within the scope of the present invention.

The thin-film transistor substrate preferably further comprises AlOx (0<x≦0.8) at the interface between the Al—Ni alloy thin film and the transparent pixel electrode. The electrically conductive oxide AlOx at the interface functions to reduce the contact resistivity at the interface to about $8 \times 10^{-5}$ $\Omega \cdot cm^2$ or lower.

The AlOx has a thickness of preferably 1 to 10 nm, more preferably 2 to 8 nm, and further preferably around 5 nm.

According to conventional techniques, pure aluminum or an Al—Nd alloy is brought into direct contact with the transparent conductive film, and this causes a high contact resistance, and the contact herein is a non-Ohmic contact. This is probably because an aluminum oxide layer formed at the contact interface is a film containing oxygen in an amount substantially equal to the stoichiometric aluminum oxide ($Al_2O_3$) and thereby showing a higher resistance, and, in addition, the aluminum oxide layer has a large thickness.

The electrically conductive oxide film (AlOx) is preferably deposited, for example, in the following manner. Initially, an ITO film for constituting the transparent pixel electrode is deposited to a thickness of about 5 to 20 nm, preferably around 10 nm, by sputtering at a substrate temperature of preferably about 100° C. to 200° C. using a non-oxidative gas such as argon gas. During this procedure, namely, in early stages of the deposition of the ITO film constituting the transparent pixel electrode, the film deposition is preferably carried out in an atmosphere substantially free from oxygen so as to avoid oxidation of the surface of the Al—Ni alloy thin film. When the film deposition is conducted in an atmosphere substantially free from oxygen in this manner, the resulting ITO film deposited by sputtering contains a less amount of oxygen to thereby decrease the electrical conductivity of the ITO film itself. However, the reduction in electrical conductivity can be compensated by appropriately heating the substrate during this process, because the crystallinity of ITO increases as a result of such heating.

Next, the atmospheric gas is changed from the non-oxidative gas to an oxygen-containing gas comprising a non-oxidative gas and oxygen gas, and a film is deposited, for example, to a thickness of about 20 to 200 nm, preferably around 40 nm while maintaining the temperature of the substrate. The oxygen content of the atmospheric gas herein is not specifically limited but is preferably so set that the oxygen partial pressure is 10 to 50 μTorr, preferably around 20 μTorr with respect to the argon pressure, for example, of about 1 to 5 mTorr, preferably around 3 mTorr. The present inventors have experimentally revealed that the electrical resistivity of the deposited ITO film is minimized to about $1 \times 10^{-4}$ $\Omega \cdot cm^2$ when deposited under these conditions. The same advantages can be obtained by adding water vapor instead of oxygen to the atmospheric gas. Thus, the ITO film itself can have a sufficiently high electrical conductivity while preventing the oxidation of the aluminum alloy film in early stages of the deposition of ITO film, by carrying out the deposition of ITO film by sputtering in two or more steps while changing the oxygen content of the atmospheric gas.

A nickel-enriched layer is preferably present at the interface between the Al—Ni alloy thin film and the transparent pixel electrode. The nickel-enriched layer has an average nickel concentration preferably 2 times or more, and more preferably 2.5 times or more, higher than the average nickel concentration of the Al—Ni alloy. By satisfying this, the contact resistivity of the interface can further be reduced to about $8 \times 10^{-5}$ $\Omega \cdot cm^2$ or lower. The nickel-enriched layer has a thickness of preferably 0.5 nm or more and 10 nm or less, and more preferably 1.0 nm or more and 5 nm or less.

Sample liquid crystal display devices were prepared by using the Al—Ni alloy thin films and were found to realize thin-film transistor properties equivalent to or superior to those of liquid crystal display devices using conventional aluminum alloy thin films with the interposition of barrier metal layers made typically of molybdenum, as demonstrated in Experimental Examples mentioned later. Accordingly, the present invention eliminates the need of barrier metal layers, thereby simplifies the manufacturing processes of thin-film transistor substrates, and reduces the production cost. In addition, the present invention enables sufficiently reduced electrical resistivity as a result of heating at relatively low temperatures of about 200° C. and permits to select the types of display device materials and process conditions within wider ranges.

Certain preferred embodiments of the thin-film transistor substrates according to the present invention will be illustrated below, with reference to the attached drawings. Such preferred embodiments will be illustrated by taking a liquid crystal display device comprising an amorphous silicon thin-film transistor substrate as a representative example. It is to be noted that the followings are only examples which by no means limit the scope of the present invention, and various changes and modifications are possible therein without departing from the teaching and scope of the present invention. The present inventors have experimentally verified that the Al—Ni alloy thin films for use in the present invention can also be applied to, for example, reflective electrodes typically for reflective liquid crystal display devices, and TAB connecting electrodes for input and output of signals from or to the outside.

First Embodiment

An embodiment of the amorphous silicon thin-film transistor substrates according to the present invention will be illustrated in detail with reference to FIG. 3.

FIG. 3 is a schematic cross-sectional view illustrating a preferred embodiment of the thin-film transistor substrates according to the present invention. In FIG. 3, components corresponding to those in the conventional thin-film transistor substrate in FIG. 2 have the same reference numerals.

Figure 2:
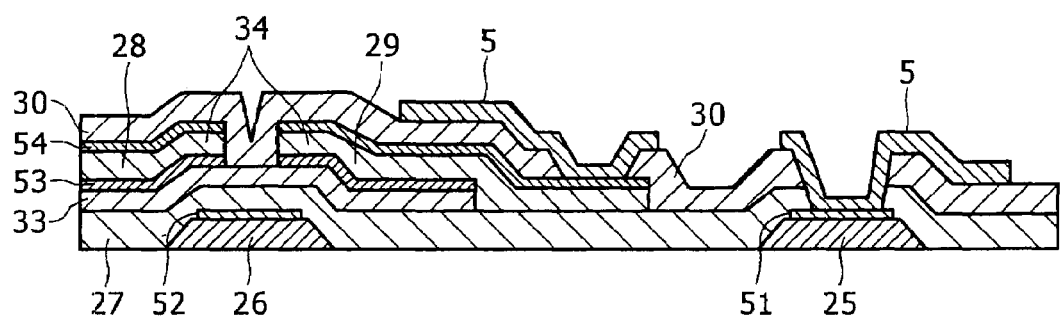
FIG. 2 is a schematic sectional view illustrating the configuration of a representative conventional amorphous silicon thin-film transistor substrate.

A comparison between FIG. 2 and FIG. 3 shows that the conventional thin-film transistor substrate comprises the lower barrier metal layer 53 made typically of molybdenum (Mo) below the source/drain electrodes (FIG. 2); whereas the thin-film transistor substrate according to the present invention does not include the lower barrier metal layer 53 (FIG. 3). This embodiment enables direct connection between the aluminum alloy and the channel amorphous silicon thin film without the interposition of the lower barrier metal layer, in contrast to conventional equivalents. This realizes good thin-film transistor properties equivalent to or higher than those of the conventional thin-film transistor substrate (see after-mentioned Experimental Examples 1 and 2).

The embodiment illustrated in FIG. 3 includes an upper barrier metal layer 54 arranged on the source/drain interconnection. However, the upper barrier metal layer 54 can also be omitted, as in Second Embodiment of the present invention described later.

In addition, the present invention can further eliminate the need of the barrier metal layers 51 and 52 arranged on the scanning line 25 and the gate electrode 26, respectively, in the thin-film transistor substrate shown in FIG. 3.

Consequently, the present invention can eliminate the need of all the barrier metal layers essential for conventional interconnections.

Next, a method for manufacturing the thin-film transistor substrate shown in FIG. 3 according to the present invention will be illustrated with reference to FIGS. 4A to 4F. An Al—Ni alloy containing 2.0 atomic percent of nickel was used as the source/drain electrode. The components in FIGS. 4A to 4F corresponding to those in FIG. 3 have the same reference numerals.

Figure 4A:
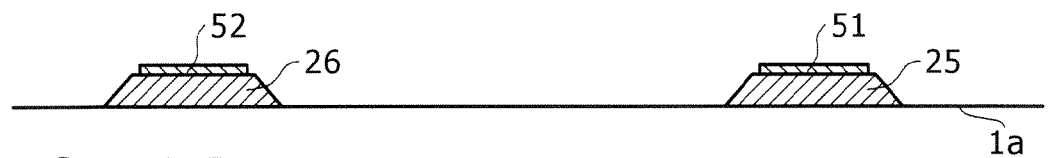
FIGS. 4A, 4B, 4C, 4D, 4E, and 4F are process drawings illustrating the method for manufacturing the thin-film transistor substrate of FIG. 3.

Initially, an aluminum alloy thin film (Al-2.0 atomic percent Nd) 61 having a thickness of about 250 nm, and a molybdenum thin film 52 having a thickness of about 50 nm were sequentially deposited on a glass substrate 1a by sputtering. The film-deposition by sputtering was carried out at room temperature. The multilayer thin film was patterned to thereby form a gate electrode 26 and a scanning line 25 (FIG. 4A). In this procedure, the periphery of the multilayer thin film is preferably etched in a taper-shape at an angle of about 30° to about 60° so as to improve the coverage of a gate insulator 27 to be deposited thereon in the subsequent step shown in FIG. 4B.

Figure 4B:
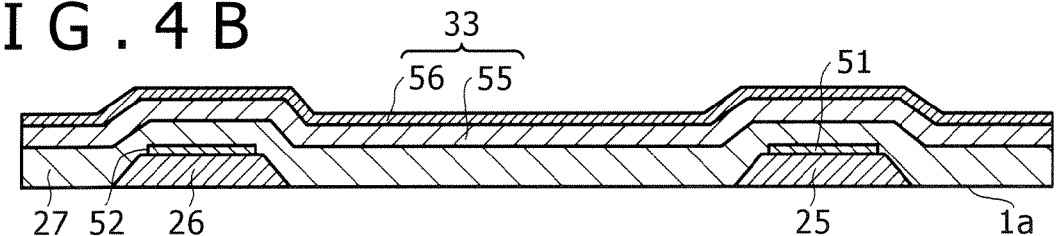

Next, a silicon nitride film (gate insulator) 27 having a thickness of about 300 nm was deposited typically by plasma CVD (FIG. 4B). The film-deposition by plasma CVD herein was conducted at a temperature of about 350° C. On the silicon nitride film (gate insulator) 27 were sequentially deposited an undoped hydrogenated amorphous silicon film (a-Si—H) 55 having a thickness of about 200 nm and a phosphorus-doped n+-type hydrogenated amorphous silicon film (n+ a-Si—H) 56 having a thickness of about 80 nm typically by plasma CVD. The n+-type hydrogenated amorphous silicon film was deposited, for example, by carrying out plasma CVD using a gas containing a specific partial pressure of $PH_3$.

Figure 4C:
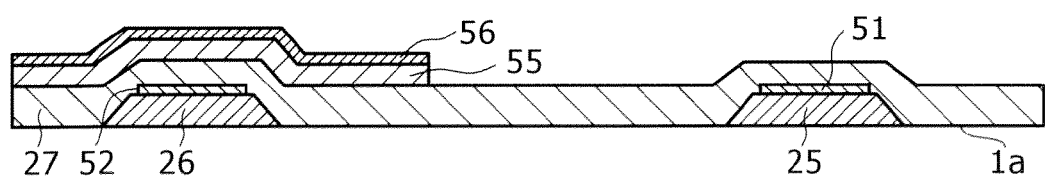

The thus-deposited hydrogenated amorphous silicon film 55 and n+-type hydrogenated amorphous silicon film 56 were patterned (FIG. 4C).

Figure 4D:
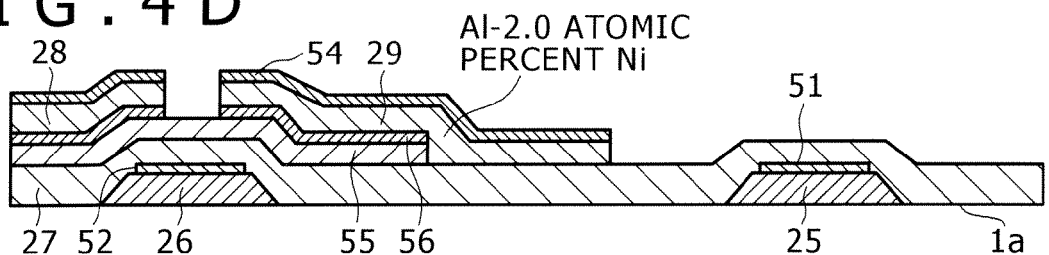

Next, an Al-2.0 atomic percent Ni alloy film having a thickness of about 300 nm and a molybdenum film 54 having a thickness of about 50 nm were sequentially deposited by sputtering (FIG. 4D). The film-deposition by sputtering was carried out at room temperature. According to this embodiment, an OFF-state current substantially equivalent to that in the conventional equivalent can be achieved even without the interposition of the lower barrier metal layer. In the conventional equivalent, the lower barrier metal layer of molybdenum is arranged under the amorphous silicon thin film. In this embodiment, the molybdenum film 54 is arranged on the Al-2.0 atomic percent Ni alloy film. However, the molybdenum film 54 can be omitted as in after-mentioned Second Embodiment.

The multilayer thin film was then patterned to thereby form a source electrode 28 and a drain electrode 29 (FIG. 4D). The n+-type hydrogenated amorphous silicon film 56 was stripped by dry etching using the source electrode 28 and the drain electrode 29 as a mask (FIG. 4D).

Figure 4E:
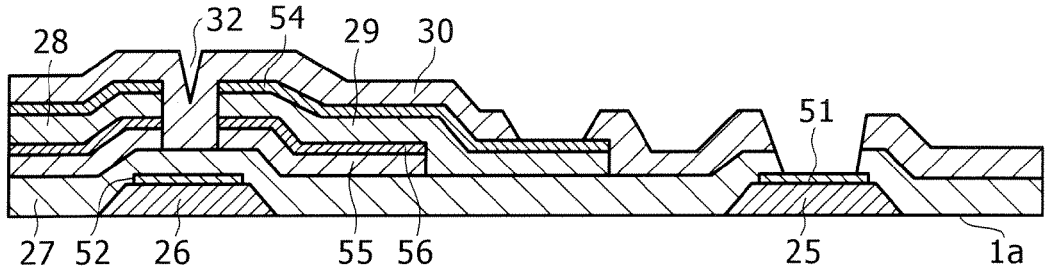
Figure 4F:
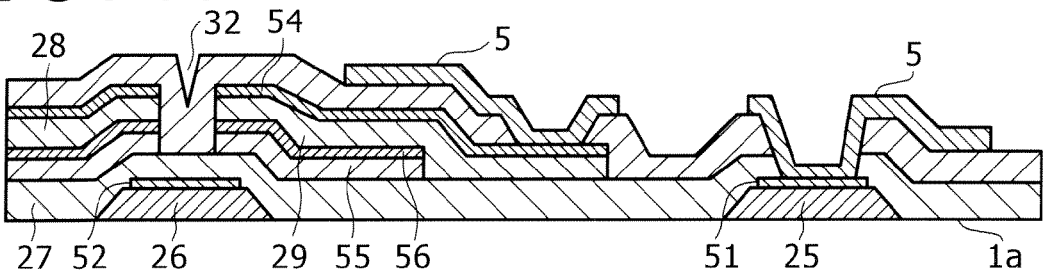

A silicon nitride film (protecting film) 30 was deposited to a thickness of about 300 nm typically in a plasma CVD system (FIG. 4E). The film deposition herein was conducted at a temperature of about 200° C. Next, a contact hole 57 was formed by subjecting the silicon nitride film 30 typically to dry etching.

Next, an ashing step typically using oxygen plasma was conducted, and the photoresist layer (not shown) was stripped using a remover containing, for example, an amine. An ITO film (indium oxide further containing 10 percent by mass of tin oxide) was deposited to a thickness of about 50 nm. Next, patterning by wet etching was carried out to thereby yield a transparent pixel electrode 5. Thus, the thin-film transistor substrate was completed.

The transparent pixel electrode 5 herein is an ITO film, but it can also be an IZO film. Instead of an amorphous silicon, a polysilicon (polycrystalline silicon) can be used as the active semiconductor layer.

The liquid crystal display device shown in FIG. 1 is prepared by using the above-prepared thin-film transistor substrate, for example, by the following method.

Initially, an alignment layer is formed by applying a film of, for example, a polyimide to the thin-film transistor substrate 1, drying the film, and carrying out rubbing.

Regarding a counter substrate 2, a light shielding film 9 is formed on a glass substrate by patterning, for example, chromium as a matrix. Next, red, green, and blue resinous color filters 8 are formed in interstices in the matrix-shaped light shielding film 9. A transparent conductive film, such as an ITO film, is formed as a common electrode 7 on the light shielding film 9 and the color filter 8. Thus, the counter electrode is provided. An alignment layer 11 is then formed by applying a film of, for example, a polyimide to the uppermost layer of the counter electrode, drying, and rubbing the resulting film.

Next, the thin-film transistor substrate 1 and the counter substrate 2 are placed so that the TFT of the thin-film transistor substrate 1 and the alignment layer 11 of the counter substrate 2 face each other. These two substrates are bonded, except for a filling port for a liquid crystal, using a sealing material 16 such as a resin. In this procedure, the distance (gap) between the thin-film transistor substrate 1 and the counter substrate 2 is kept substantially constant by, for example, interposing a spacer 15 between them.

The thus-prepared empty cell is filled with a liquid crystal material to form a liquid crystal layer by placing the cell in a vacuum, and gradually increasing the pressure to an atmospheric pressure while immersing the filling port in the liquid crystal material. The filling port is then sealed. Finally, polarizers 10 are attached to the both sides of the cell to complete a liquid crystal display panel.

Next, a driver circuit 13 is electrically connected to the liquid crystal display panel and is arranged on a lateral side or backside of the liquid crystal display panel (FIG. 1), so as to drive the liquid crystal display device. A frame 23 having an opening to be a screen of the liquid crystal display panel, a backlight 22 as a flat light source, an optical waveguide 20, and another frame 23 are arranged so as to hold the liquid crystal display panel to thereby complete the liquid crystal display device.

Second Embodiment

A thin-film transistor substrate according to Second Embodiment has the same configuration as the thin-film transistor substrate according to First Embodiment as illustrated in FIG. 2, except for not arranging both the upper barrier metal layer 54 and the lower barrier metal layer 53. The thin-film transistor substrate according to First Embodiment does not include the lower barrier metal layer 53 but includes the upper barrier metal layer 54.

The thin-film transistor substrate according to Second Embodiment can be prepared by the procedure of First Embodiment, except for forming an aluminum alloy thin film (Al-2.0 atomic percent Nd) having a thickness of about 300 nm alone on a glass substrate 1a and not forming a molybdenum film. In the thin-film transistor substrate according to Second Embodiment, the Al—Ni alloy thin film is directly connected not only to the amorphous silicon thin film but also to the transparent pixel electrode. This embodiment can not only eliminate the need of the upper barrier metal layer of the interconnection to be connected to the transparent pixel electrode but also realize good thin-film transistor properties equivalent to or superior to those of conventional thin-film transistor substrates, as demonstrated in Experimental Examples 3 and 4.

EXPERIMENTAL EXAMPLES

Experimental Example 1

Experimental Example 1 and after-mentioned Experimental Example 2 were conducted so as to verify that excellent thin-film transistor properties, for example, can be obtained even without the lower barrier metal layer by using the thin-film transistor substrate according to First Embodiment. An Al-2.0 atomic percent Ni alloy was used as the source/drain electrode in Experimental Examples 1 and 2, and this alloy thin film is hereinafter briefly referred to as "Al—Ni alloy thin film".

In Experimental Examples, the nickel content, the thicknesses of the nickel-enriched layer and aluminum oxide film were determined by RF glow discharge emission spectrometry (GD-OES) and observation on cross-sectional transition electron micrograph, respectively. The nickel content of the nickel-enriched layer and the oxygen content in the aluminum oxide film were determined by compositional analyses of cross-sectional transition electron micrographs by EDX.

Observation of the Interface Between the Amorphous Silicon Thin Film and the Al—Ni Alloy Thin Film Initially, the presence of a nickel-enriched layer excellent in electrical conductivity in the vicinity of the interface between the amorphous silicon thin film and the Al—Ni alloy thin film for source/drain electrode according to the present invention was detected. This was verified with reference to sequential manufacturing processes of the thin-film transistor substrate.

Figure 5A:
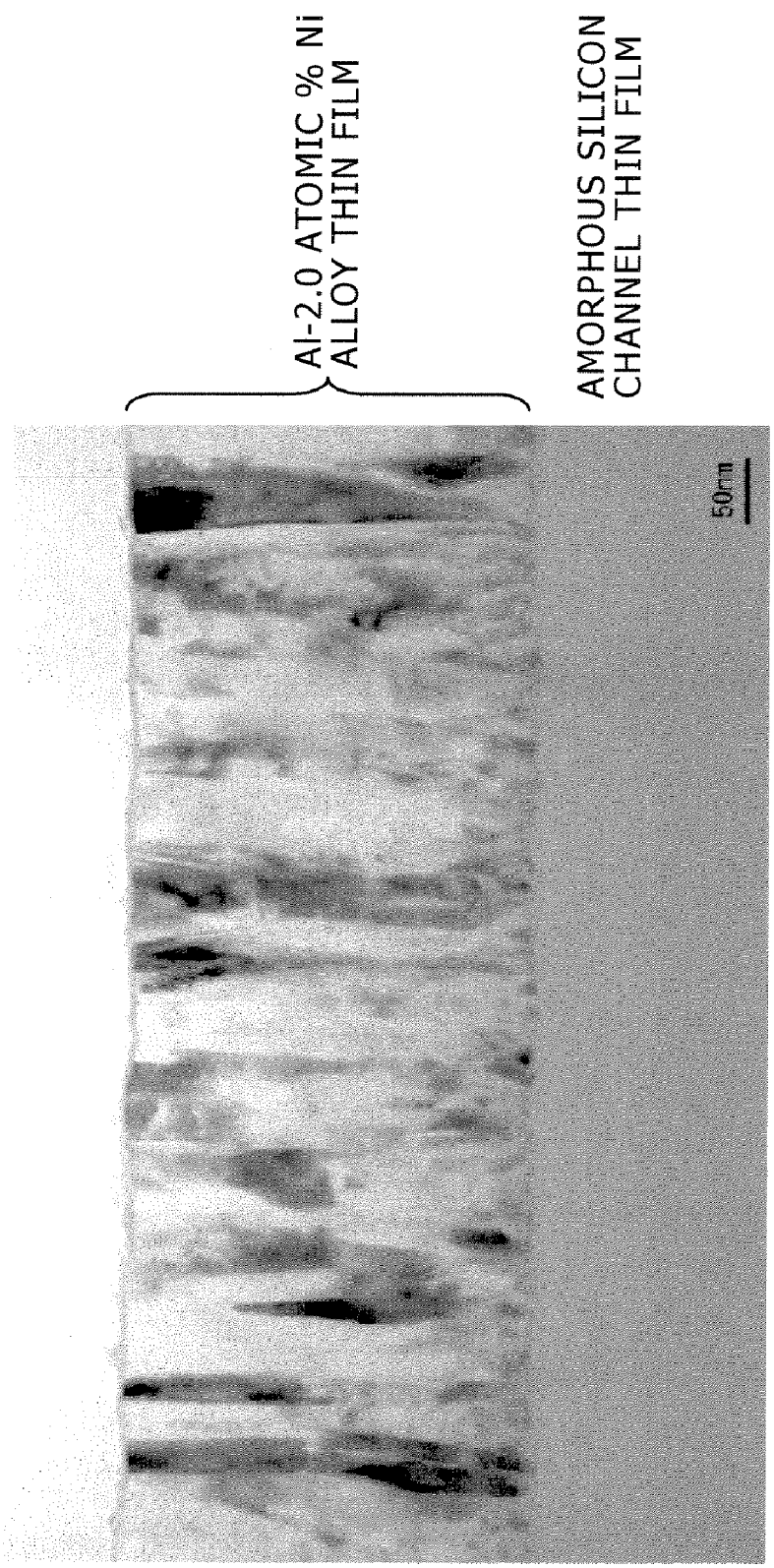
FIG. 5A is across-sectional transmission electron micrograph of the interface between an Al—Ni alloy thin film and an amorphous silicon thin film immediately after deposition of the Al—Ni alloy on the amorphous silicon thin film at room temperature according to First Embodiment of the present invention.

Specifically, the vicinity of the interface was observed immediately after the deposition of the Al—Ni alloy thin film on the amorphous silicon thin film at room temperature. FIGS. 5A and 5B are a cross-sectional transmission electron micrograph (cross-sectional TEM) and a high-angle annular dark-field scanning transmission electron micrograph (HAADF-STEM), respectively, of the interface between an Al—Ni alloy thin film and an amorphous silicon thin film immediately after deposition of the Al—Ni alloy on the amorphous silicon thin film at room temperature according to First Embodiment of the present invention. The cross-sectional transmission electron micrograph reveals the composition of the interface, and HAADF-STEM shows the distribution of nickel.

FIG. 5A shows that the Al—Ni alloy thin film has columnar grain boundaries. The interface was analyzed by EDX (energy dispersive X-ray spectroscopy) to find that there is observed no interdiffusion between silicon and aluminum.

The bright portion indicated by the arrow in FIG. 5B is nickel. Specifically, nickel is decreased in the Al—Ni alloy thin film at the surface even immediately after the deposition of the Al—Ni alloy thin film on the amorphous silicon thin film.

Figure 6B:
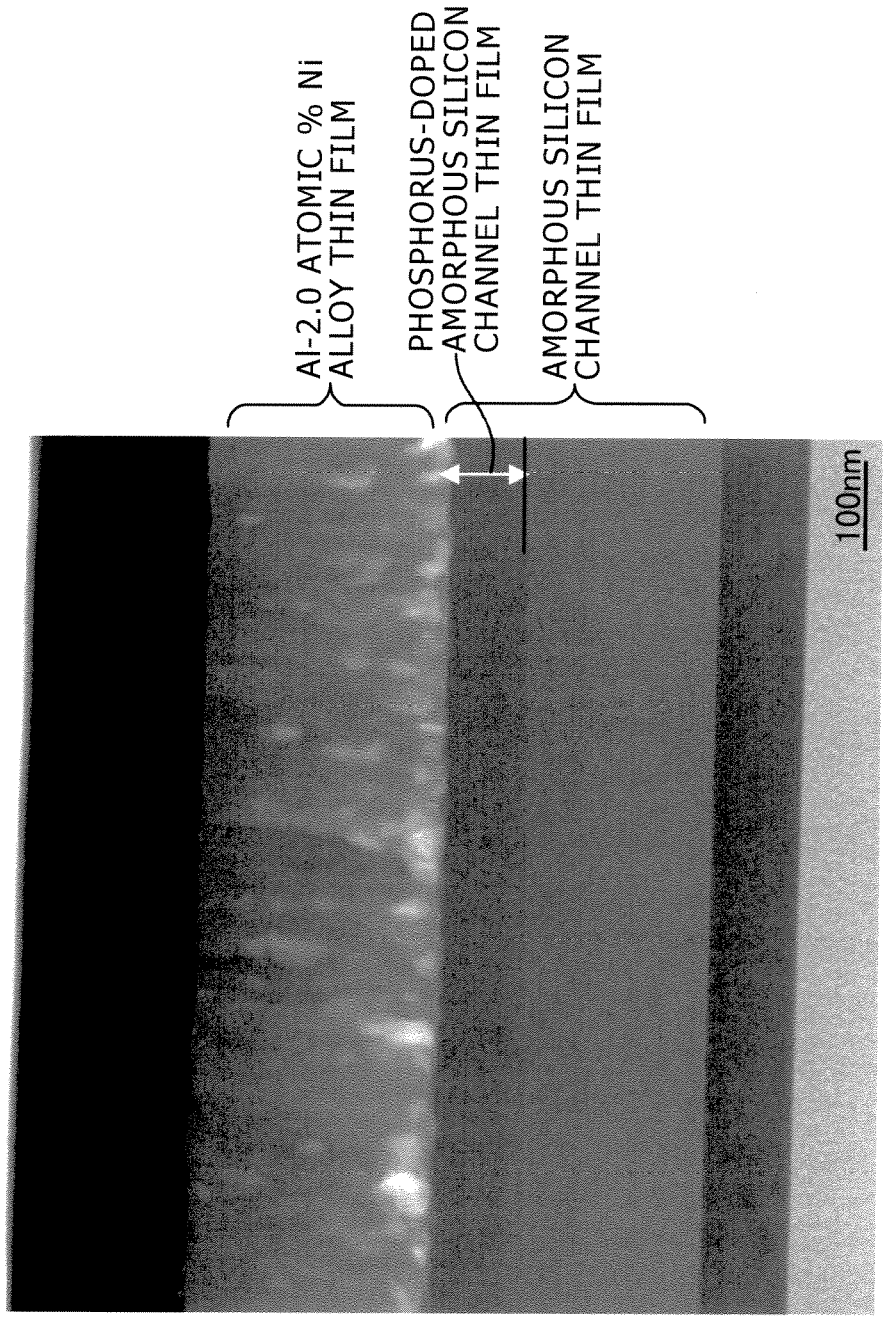
FIG. 6B is a high-angle annular dark-field scanning transmission electron micrograph (HAADF-STEM) of the interface taken under the same condition as in FIG. 6A.

Next, the vicinity of the interface between the amorphous silicon thin film and the Al—Ni alloy thin film was observed after the completion of the manufacturing processes of the thin-film transistor substrate. FIGS. 6A and 6B are a cross-sectional transmission electron micrograph (cross-sectional TEM) and a high-angle annular dark-field scanning transmission electron micrograph (HAADF-STEM), respectively, of the interface.

As is described above, various film-deposition steps are conducted after the deposition of the Al—Ni alloy thin film on the amorphous silicon thin film so as to prepare the thin-film transistor substrate according to this embodiment. Of these steps, the step in which the thermal hysteresis attains the highest temperature is the step of depositing the silicon nitride film (protecting film), in which a heat treatment including preheating is carried out at 200° C. for twenty minutes.

FIG. 6A demonstrates that nickel in the substrate according to this embodiment maintains its columnar grain boundaries even after the film-deposition steps. In addition, the interface between the amorphous silicon thin film and the Al—Ni alloy thin film is smooth, as in FIG. 5A, and EDX analysis reveals that there is observed no interdiffusion between silicon and aluminum.

FIG. 6B shows that nickel-containing precipitates or intermetallic compounds are formed at the interface.

In addition, the distribution of nickel concentration in the vicinity of the interface between the amorphous silicon thin film and the Al—Ni alloy thin film after the completion of manufacturing steps of the thin-film transistor substrate was determined by RF glow discharge emission spectrometry (GD-OES). According to GD-OES, sputtering by argon glow discharge is conducted, and intrinsic photoemissions of sputtered elements are measured so as to determine the concentrations of the elements. In Experimental Example 1, the sputtering area was an area of 3 mm diameter, and the average nickel concentration in the two-dimensional space having a diameter of 3 mm was determined. The result is shown in FIG. 7B.

As a comparison, the nickel concentration distribution in the vicinity of the interface immediately after the deposition of the Al—Ni alloy thin film on the amorphous silicon thin film at room temperature was determined by the above procedure. The result is shown in FIG. 7A.

Figure 7A:
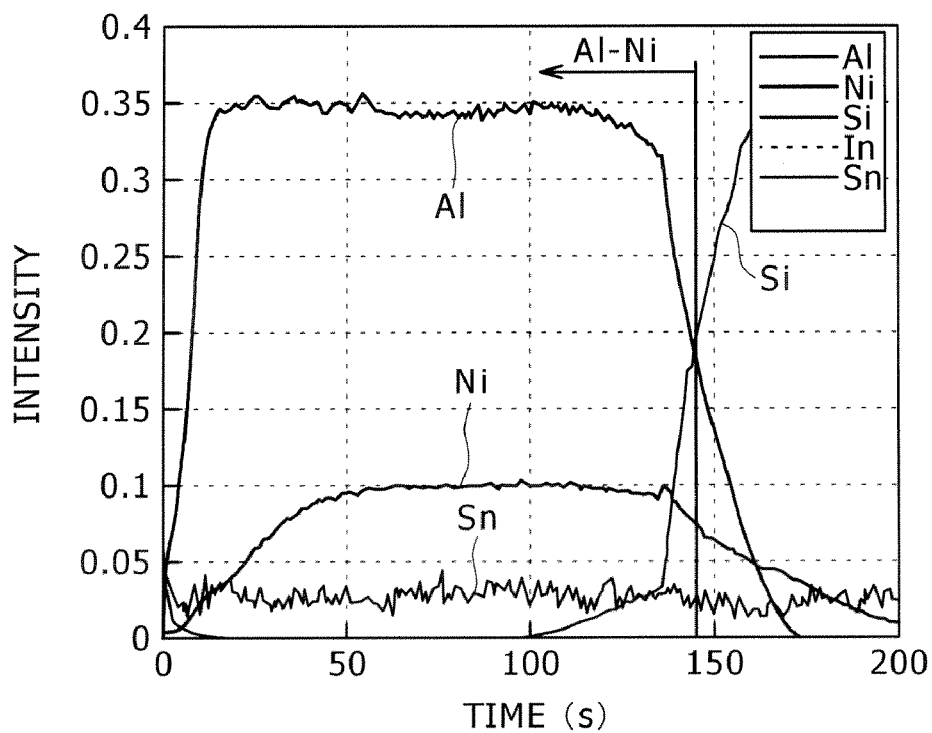
FIGS. 7A and 7B are diagrams showing the distribution of element concentration in a depth direction in the vicinity of the interface between an Al—Ni alloy thin film and an amorphous silicon thin film immediately after the deposition of the Al—Ni alloy thin film on the amorphous silicon thin film at room temperature and after the completion of the manufacturing processes of the thin-film transistor, respectively, in First Embodiment of the present invention.
Figure 7B:
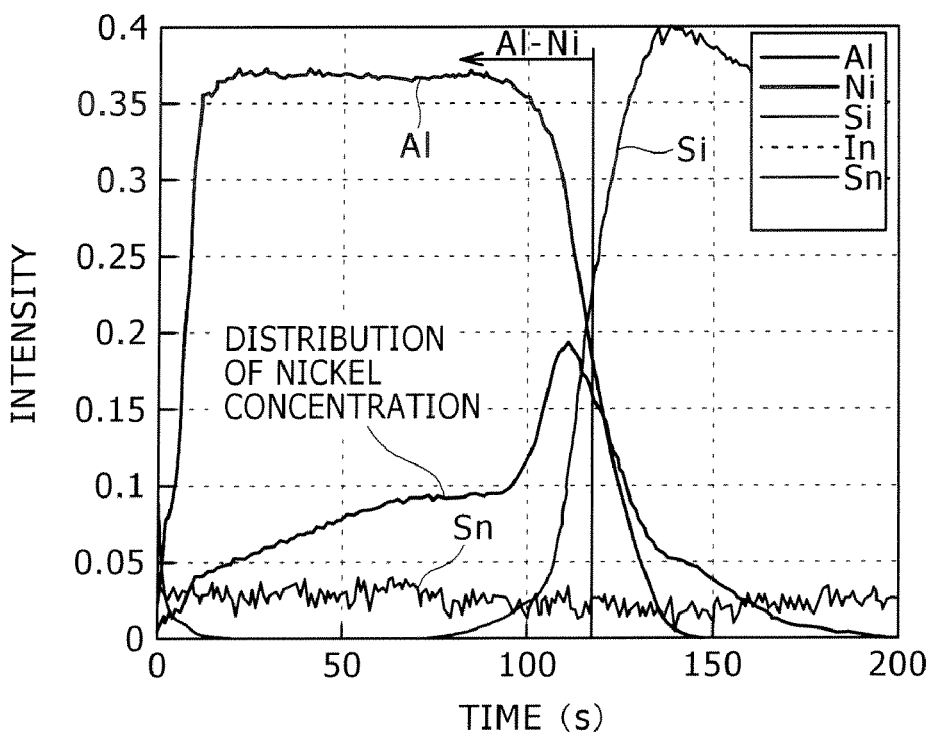

A comparison between FIG. 7A and FIG. 7B demonstrates that the vicinity of the interface has a substantially homogenous nickel concentration immediately after the deposition of the Al—Ni alloy thin film except for the film surface, but a nickel-enriched layer is formed in the vicinity of the interface after the completion of all the film-deposition steps. This result agrees with the result of the high-angle annular dark-field scanning transmission electron micrograph (HAADF-STEM) analysis shown in FIG. CB. The nickel-enriched layer probably comprises a precipitated $Al_3Ni$ intermetallic compound. Specifically, the nickel-enriched layer is formed in the Al—Ni alloy thin film within 50 nm from the interface and has a highest nickel content of about 4.0 atomic percent.

Thin-film Transistor Properties

The switching behaviors on drain current-gate voltage of the TFT test pieces were determined. The diffusion of aluminum into the amorphous silicon thin film can also be evaluated by this property. In this procedure, the leak current and threshold were determined in the following manner. The leak current is a current flowing when the thin-film transistor is turned off (the drain current when a negative voltage is applied to the gate voltage; OFF-state current), and the threshold (gate voltage) is a voltage when the thin-film transistor is turned on.

Using TFT test pieces having a gate length (L) of 3 μm, a gate width (W) of 30 μm, and a ratio of the gate width to the gate length (W/L) of 10, the drain current and the gate voltage were measured. In the measurement, the drain voltage was set at 10 V. The OFF-state current herein was defined as the current when a gate voltage at −5 V was applied, and the threshold was defined as the gate voltage when the drain current reached $10^{-8}$ A.

As a referential sample, a thin-film transistor was prepared using a conventional multilayer source/drain interconnection comprising an Al—Nd alloy thin film and upper and lower molybdenum barrier metal layers, and the properties of the thin-film transistor were measured. The conventional thin-film transistor had an OFF-state current of $3 \times 10^{-12}$ A, and this value was defined as the reference value. A sample having an OFF-state current ten folds or less as high as the reference value ($3 \times 10^{-11}$ A or less) was evaluated as "Good", and one having an OFF-state current higher than this range was evaluated as "Poor" (No Good).

The thin-film transistor according to the present invention has an OFF-state current of $5\times10^{-12}$ A, which is substantially equivalent to that ($3\times10^{-12}$ A) of the referential sample using the conventional multilayer source/drain interconnection comprising an Al—Nd alloy thin film and upper and lower molybdenum barrier metal layers. The thin-film transistor according to this embodiment has a threshold of 0.45 V, which is the same as that (0.45 V) of the referential sample using the conventional multilayer interconnection.

These results verify that the thin-film transistor substrate according to this embodiment realizes, even without the lower barrier metal layer, thin-film transistor properties substantially equivalent to those of the thin-film transistor substrate using the conventional source/drain interconnection.

Comparative Example 1

A thin-film transistor substrate as a comparative example was prepared by the procedure of First Embodiment, except for using pure aluminum as the source/drain interconnection instead of the Al-2.0 atomic percent Ni alloy. Next, the vicinity of the interface between the amorphous silicon thin film and the pure aluminum thin film for source/drain electrode was observed under a transmission electron microscope by the procedure of Experimental Example 1.

Initially, the vicinity of the interface was observed immediately after the deposition of the pure aluminum film on the amorphous silicon thin film at room temperature. FIGS. 8A and 8B are a transmission electron micrograph and an enlarged micrograph (at a higher magnification) thereof, respectively, showing the cross section of the interface. The result of EDX analysis is also shown in FIG. 8B.

FIGS. 8A and 8B show that the pure aluminum thin film has irregular grain boundaries. The EDX analysis of the interface revealed that aluminum is present in a content of about 10 atomic percent in the amorphous silicon thin film within about 10 nm from the interface. Specifically, the sample according to Comparative Example 1 shows aluminum diffusion at the interface even immediately after the deposition of pure aluminum thin film on the amorphous silicon thin film.

Figure 9A:
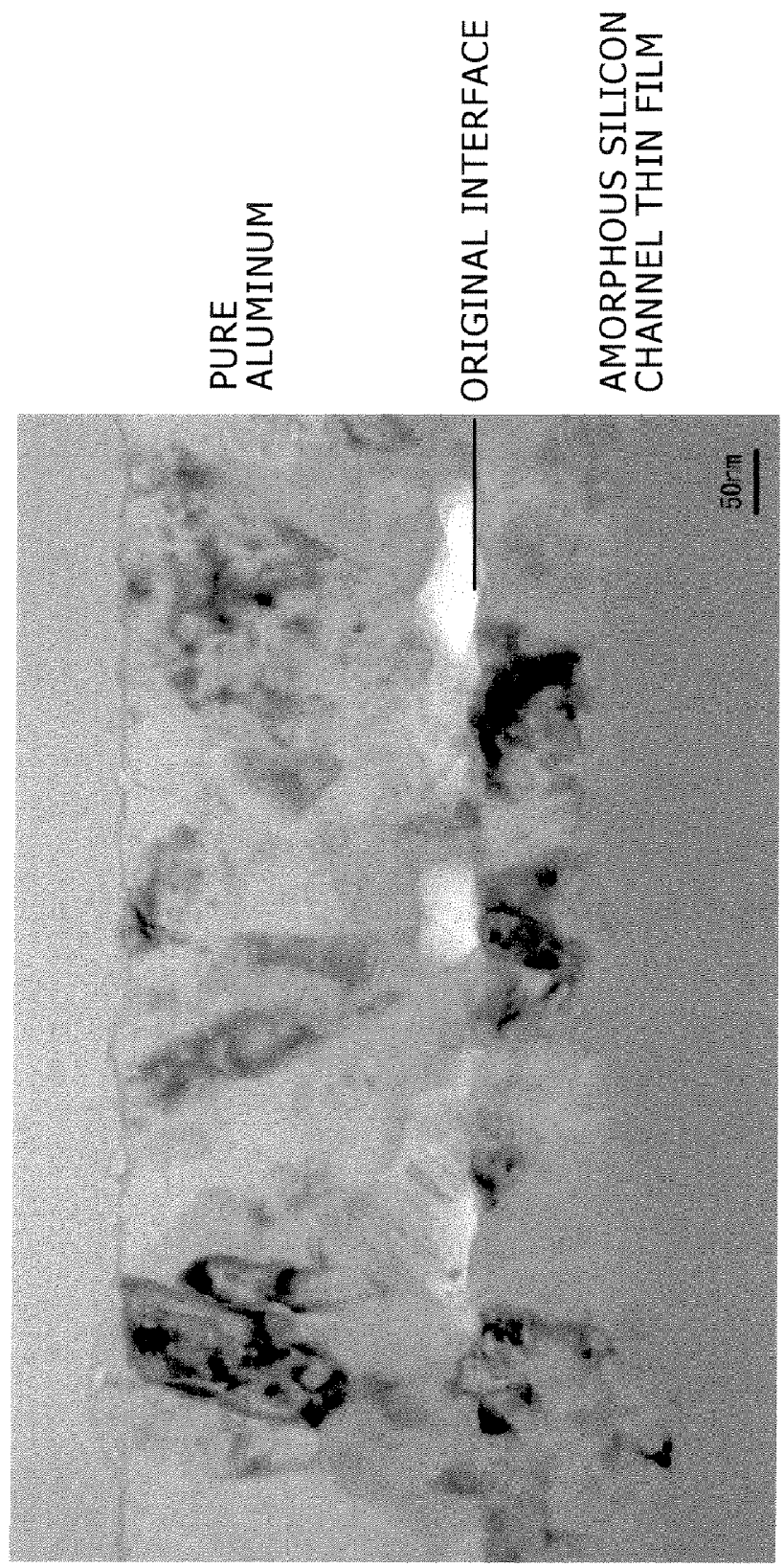
FIG. 9A is across-sectional transmission electron micrograph of the interface between the amorphous silicon thin film and the pure aluminum thin film after the completion of all the film-deposition steps for manufacturing the thin film transistor substrate according to Comparative Example 1.

Next, the vicinity of the interface between the amorphous silicon thin film and the pure aluminum thin film was observed in the same manner as above after the completion of all the film-deposition steps for manufacturing the thin film transistor substrate. FIG. 9A is a cross-sectional transmission electron micrograph of the interface, and FIG. 9B shows mapping images (silicon map and aluminum map) as a result of EDX analysis of the same portion as the transition electron micrograph of FIG. 9A.

FIG. 9A demonstrates that aluminum further diffuses and interdiffusion between aluminum and silicon occurs in the vicinity of the interface after the completion of all the film-deposition steps in the sample according to Comparative Example 1.

Figure 9B:
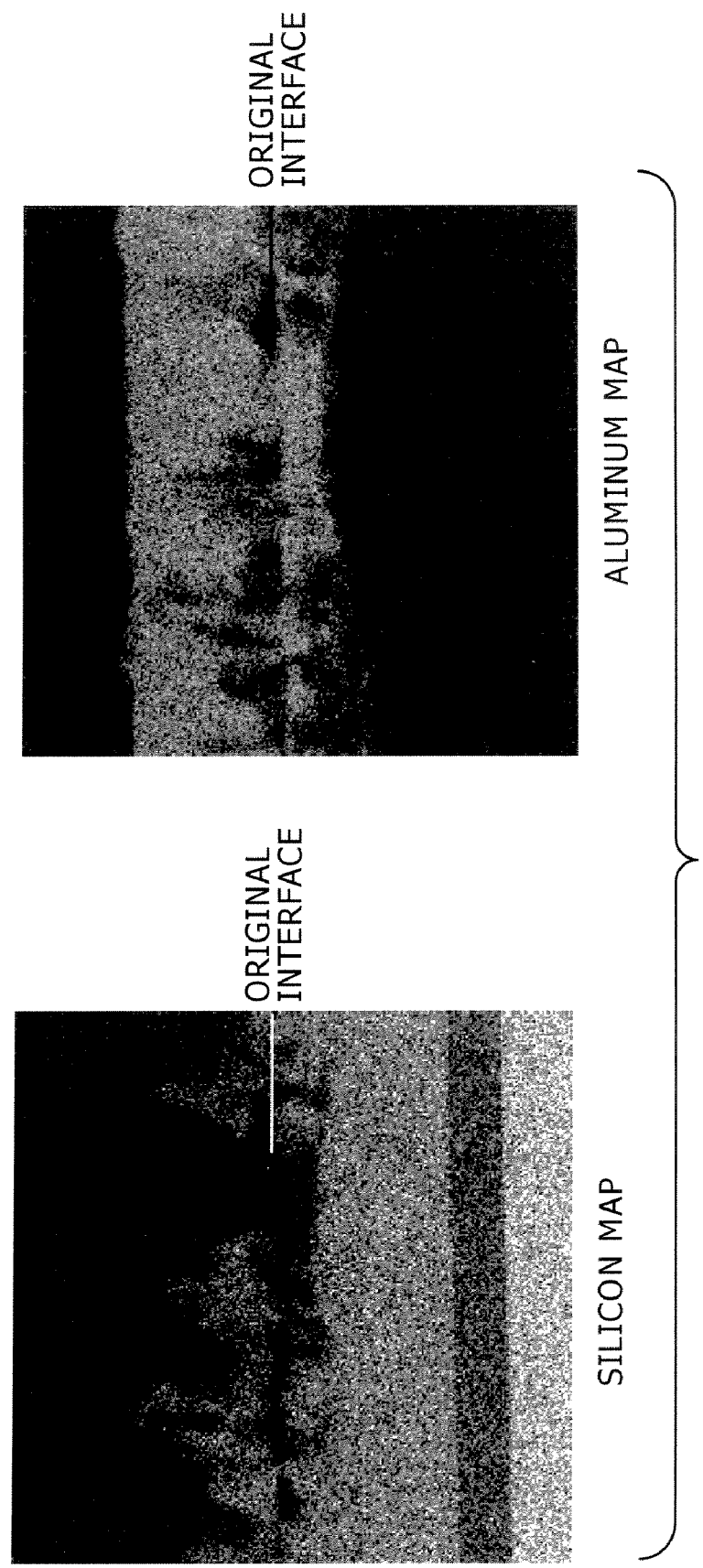
FIG. 9B shows mapping images (silicon map and aluminum map) as a result of EDX analysis of the same portion as the transition electron micrograph of FIG. 9A.

Specifically, the silicon map and aluminum map in FIG. 9B show that aluminum diffuses into the amorphous silicon layer within about 100 nm from the interface, and that silicon diffuses into the pure aluminum thin film within about 250 nm from the interface.

The thin-film transistor properties of the sample according to Comparative Example 1 were determined by the procedure of Experimental Example 1. The thin-film transistor was found to have an OFF-state current of $1\times10^{-8}$ A, much higher than the OFF-state current ($3\times10^{-12}$ A) of the referential sample using the conventional multilayer interconnection. In addition, the thin-film transistor has a threshold of 2.5V, much higher than the threshold (0.45 V) of the referential sample using the conventional multilayer interconnection.

These results demonstrate that if a thin-film transistor comprises a pure aluminum source/drain interconnection but does not comprise the lower barrier metal layer, the thin-film transistor cannot substantially exhibit switching behavior. Accordingly, the thin-film transistor using a pure aluminum source/drain interconnection must have a barrier metal layer.

Experimental Example 2

Thin-film transistor samples were prepared using Al—Ni alloys having varying nickel contents shown in Table 1, and how thin-film transistor properties (OFF-state current and threshold) vary depending on the composition of Al—Ni alloy was determined by the procedure of Experimental Example 1. In addition, thin-film transistors using Al-2.0 atomic percent Ni alloys further comprising, as a third component, varying contents of La or Nd as shown in Table 1 were prepared, and the thin-film transistor properties thereof were determined in the same manner.

As comparative samples, thin-film transistors were prepared using pure aluminum, Mo, Al-1 atomic percent Si, and Al-2 atomic percent Si, respectively, instead of the Al—Ni alloy, and the thin-film transistor properties thereof were determined.

The OFF-state current was evaluated in the following manner. As a referential sample, a thin-film transistor was prepared using conventional multilayer source/drain interconnections comprising an Al—Nd alloy thin film and upper and lower molybdenum barrier metal layers, and the properties of the TFT were measured. The referential sample had an OFF-state current of $3\times10^{-12}$ A, and this value was defined as the reference value. A sample having an OFF-state current ten times or less the reference value ($3\times10^{-12}$ A), namely, a sample having an OFF-state current of $3\times10^{-11}$ A or less was evaluated as "Good", and one having an OFF-state current higher than this range was evaluated as "Poor".

Regarding the threshold, a sample having a threshold within ±0.2 V of the threshold of molybdenum was evaluated as "Good", and one having a threshold exceeding this range was evaluated as "Poor".

By synthetically evaluating the OFF-state current and threshold, a sample being good in both OFF-state current and threshold was evaluated as having "Good" thin-film transistor properties, and one being "Poor" in at least one of the two properties was evaluated as having "Poor" thin-film transistor properties.

Thermal Stability

The thermal stabilities of the pure aluminum and aluminum alloys used in Experimental Example 2 were evaluated in the following manner.

Sample thin films respectively comprising the pure aluminum and aluminum alloys were formed to a thickness of about 200 nm on a glass substrate by sputtering. A 10 μm line and space pattern was formed on these samples. Next, the samples were subjected to heat treatment at 200° C. for one hour or at 300° C. for one hour in a vacuum of $1\times10^{-3}$ Torr or less, and the surfaces of the sample thin films were observed under an optical microscope at a magnification of 400 times. A sample showing more than $1\times10^9$ hillocks per square meter was evaluated as having "Poor" thermal stability, and one showing hillocks less than this range was evaluated as having "Good" thermal stability.

The results are shown in Table 1. The percentages in Table 1 are each atomic percent.

TABLE 1

| | Thin-film transistor properties | | | Thermal stability | |
|---|---|---|---|---|---|
| | OFF-state current (A) | Difference in threshold | | | |
| Source/drain electrode | after thermal hysteresis | after thermal hysteresis | Evaluation | 200° C. for 1 hr | 300° C. for 1 hr |
| Molybdenum | $3.0 \times 10^{-12}$ | — | Good | — | — |
| Al-0.1% Ni alloy | $8.0 \times 10^{-11}$ | 0.2 | Good | Good | Poor |
| Al-0.3% Ni alloy | $2.0 \times 10^{-11}$ | 0.2 | Good | Good | Poor |
| Al-0.5% Ni alloy | $1.0 \times 10^{-11}$ | 0.2 | Good | Good | Poor |
| Al-2.0% Ni alloy | $5.0 \times 10^{-12}$ | 0.1 | Good | Good | Poor |
| Al-4.0% Ni alloy | $4.0 \times 10^{-12}$ | 0.1 | Good | Good | Poor |
| Al-6.0% Ni alloy | $4.0 \times 10^{-12}$ | 0.1 | Good | Good | Poor |
| Al-2.0% Ni-0.1% La alloy | $4.5 \times 10^{-12}$ | 0.1 | Good | Good | Good |
| Al-2.0% Ni-0.3% La alloy | $4.3 \times 10^{-12}$ | 0.1 | Good | Good | Good |
| Al-2.0% Ni-2.0% La alloy | $4.0 \times 10^{-12}$ | 0.1 | Good | Good | Good |
| Al-2.0% Ni-0.1% Nd alloy | $5.0 \times 10^{-12}$ | 0.1 | Good | Good | Good |
| Al-2.0% Ni-0.3% Nd alloy | $4.5 \times 10^{-12}$ | 0.1 | Good | Good | Good |
| Al-2.0% Ni-1.0% Nd alloy | $4.0 \times 10^{-12}$ | 0.1 | Good | Good | Good |
| Pure aluminum | $1.0 \times 10^{-7}$ | 1.1 | Poor | Poor | Poor |
| Al-1.0% Si | $1.0 \times 10^{-7}$ | 0.9 | Poor | Poor | Poor |
| Al-2.0% Si | $5.0 \times 10^{-8}$ | 0.9 | Poor | Poor | Poor |
| Al-0.1% Ni-0.3% La alloy | $1.0 \times 10^{-11}$ | 0.2 | Good | Good | Good |
| Al-0.1% Ni-0.1% La alloy | $2.7 \times 10^{-11}$ | 0.2 | Good | Good | Poor |

As is demonstrated in Table 1, the thin-film transistors using aluminum alloys comprising 0.1 atomic percent or more of nickel as source/drain electrodes have good thin-film transistor properties.

In addition, the thin-film transistors using Al-2.0 atomic percent Ni alloys further comprising 0.1 atomic percent to 2.0 atomic percent of La or 0.1 atomic percent to 1.0 atomic percent of Nd as source/drain electrodes have improved thermal stability in addition to good thin-film transistor properties.

In contrast, the thin-film transistors using pure aluminum, Al-1 atomic percent Si, and Al-2 atomic percent Si are significantly poor in thin-film transistor properties and thermal stability.

Experimental Example 3

In Experimental Example 3 and after-mentioned Experimental Example 4, tests were conducted in the following manner so that the thin-film transistor substrate according to Second Embodiment can yield excellent thin-film transistor properties even without both the lower barrier metal layer and the upper barrier metal layer.

Thin-film Transistor Properties

Initially, the thin-film transistor properties of the thin-film transistor according to Second Embodiment were determined by the procedure of Experimental Example 1. The thin-film transistor was found to have an OFF-state current of $4 \times 10^{-12}$ A, substantially equivalent to the OFF-state current ($3 \times 10^{-12}$ A) of the referential sample using the conventional source/drain interconnection. The thin-film transistor has a threshold of 0.45 V, the same as the threshold (0.45 V) of the referential sample using the conventional source/drain interconnection.

Next, an Al-2.0 atomic percent Ni alloy thin film was brought into direct contact with a transparent pixel electrode, and the direct contact resistance (contact resistance) was determined in the following manner.

1) An indium tin oxide (ITO) comprising indium oxide and 10 percent by mass of tin oxide was used as the transparent pixel electrode.

2) The thin film was deposited to a thickness of 200 nm using argon gas as the atmospheric gas at a pressure of 3 m Torr.

3) Heating was carried out at 200° C. for twenty minutes.

4) Determination of contact resistivity

Figure 10:
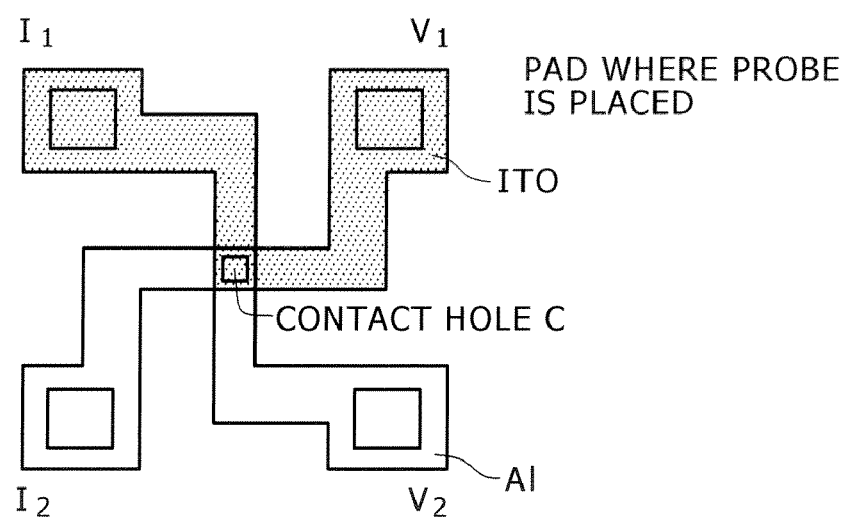
FIG. 10 is a diagram illustrating a Kelvin pattern used for the measurement of the contact resistivity between the aluminum alloy thin film and the transparent pixel electrode.

A Kelvin pattern having a contact hole size of 10 μm square shown in FIG. 10 was prepared, and a four-terminal measurement was conducted. Specifically, an electrical current was passed between an ITO (or IZO) and the aluminum alloy using two terminals, and the voltage drop between the ITO (or IZO) and the aluminum alloy was measured using the other two terminals. More specifically, a current I was passed between $I_1$-$I_2$, the voltage V between $V_1$ and $V_2$ was measured (FIG. 10), and the direct contact resistivity R of the contact C was determined by calculation according to the equation: $R=(V_2-V_1)/I_2$. The contact resistivity was evaluated as follows. By taking the contact resistivity between a chromium thin film and an ITO film as the reference value ($2 \times 10^{-4}$ $\Omega \cdot cm^2$ or lower), a sample having the contact resistivity equal to or lower than $2 \times 10^{-4}$ $\Omega \cdot cm^2$ was evaluated as "Good" in contact resistivity, and one having a contrast resistivity more than $2 \times 10^{-4}$ $\Omega \cdot cm^2$ was evaluated as "Poor" in contact resistivity.

The thin-film transistor according to Second Embodiment was found to have a contact resistivity of $8 \times 10^{-5}$ $\Omega \cdot cm^2$ or lower and to show good thin-film transistor properties.

Observation of the Interface Between ITO Film (Transparent Pixel Electrode) and Al—Ni Alloy Thin Film Next, the interface between the ITO film and the Al—Ni alloy thin film was observed by taking a cross-sectional transmission electron micrograph, and the composition in the vicinity of the interface was analyzed by EDS. The result is shown in FIG. 11.

Figure 11:
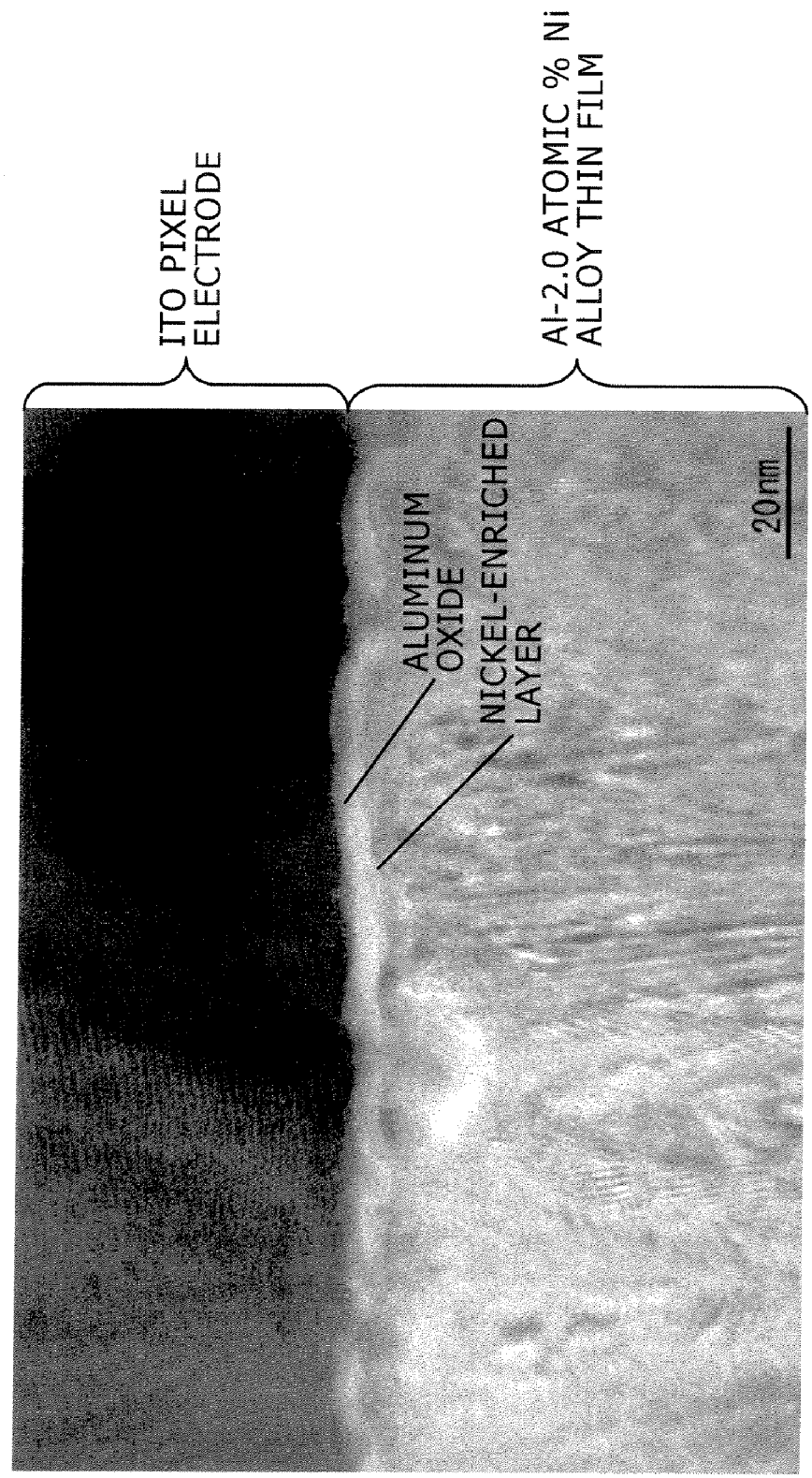
FIG. 11 is a cross-sectional transmission electron micrograph illustrating the contact interface between the transparent pixel electrode and the Al—Ni alloy thin film in Experimental Example 4.

FIG. 11 shows that an electrically conductive layer comprising an aluminum oxide (AlOx) having a thickness of about 5 nm was formed at the interface. In addition, a nickel-enriched layer having a thickness of about 1 nm was formed at the interface between the electrically conductive AlOx layer and the bulk Al—Ni alloy thin film. The nickel-enriched layer has a nickel content of about 8 atomic percent. This is probably because aluminum diffuses into the oxide film but nickel diffuses into the bulk with proceeding oxidation of aluminum, and nickel is more susceptible to remaining as a residue than aluminum upon dry etching of the contact hole. The nickel-enriched layer formed as a result of these serves to prevent the diffusion of aluminum ion from the aluminum alloy bulk. Thus, aluminum oxidation may effectively be prevented.

Experimental Example 4

Thin-film transistor samples were prepared using Al—Ni alloys having varying nickel contents shown in Table 3, and how thin-film transistor properties (OFF-state current and threshold) vary depending on the composition of Al—Ni alloy was determined by the procedure of Experimental Example 3. In addition, thin-film transistors using Al-2.0 atomic percent Ni alloys further comprising, as a third component, varying contents of La or Nd as shown in Table 3 were prepared, and the thin-film transistor properties thereof were determined in the same manner.

As comparative samples, thin-film transistors were prepared using pure aluminum, Mo, Al-1 atomic percent Si, and Al-2.0 atomic percent Si respectively, instead of the Al—Ni alloy, and the thin-film transistor properties thereof were determined. The criteria of the OFF-state current are the same as in Experimental Example 2. The results are shown in Table 2.

TABLE 2

| Source/drain electrode | Thin-film transistor properties | | | Contact resistivity with ITO ($\Omega \cdot cm^2$) |
|---|---|---|---|---|
| | OFF-state current (A) after thermal hysteresis | Difference in threshold after thermal hysteresis | Evaluation | |
| Molybdenum | $3.0 \times 10^{-12}$ | — | Good | $4.0 \times 10^{-5}$ |
| Al-0.1% Ni alloy | $8.0 \times 10^{-11}$ | 0.2 | Good | $2.0 \times 10^{-4}$ |
| Al-0.3% Ni alloy | $2.0 \times 10^{-11}$ | 0.2 | Good | $1.0 \times 10^{-4}$ |
| Al-0.5% Ni alloy | $2.0 \times 10^{-11}$ | 0.2 | Good | $9.0 \times 10^{-4}$ |
| Al-2.0% Ni alloy | $5.0 \times 10^{-12}$ | 0.1 | Good | $7.0 \times 10^{-5}$ |
| Al-4.0% Ni alloy | $4.5 \times 10^{-12}$ | 0.1 | Good | $5.0 \times 10^{-5}$ |
| Al-6.0% Ni alloy | $4.5 \times 10^{-12}$ | 0.1 | Good | $3.0 \times 10^{-5}$ |
| Al-2.0% Ni-0.1% La alloy | $4.5 \times 10^{-12}$ | 0.1 | Good | $1.0 \times 10^{-4}$ |
| Al-2.0% Ni-0.3% La alloy | $4.3 \times 10^{-12}$ | 0.1 | Good | $1.0 \times 10^{-4}$ |
| Al-2.0% Ni-2.0% La alloy | $4.5 \times 10^{-12}$ | 0.1 | Good | $2.0 \times 10^{-4}$ |
| Al-2.0% Ni-0.1% Nd alloy | $5.0 \times 10^{-12}$ | 0.1 | Good | $9.0 \times 10^{-5}$ |
| Al-2.0% Ni-0.3% Nd alloy | $4.0 \times 10^{-12}$ | 0.1 | Good | $1.0 \times 10^{-4}$ |
| Al-2.0% Ni-1.0% Nd alloy | $4.5 \times 10^{-12}$ | 0.1 | Good | $2.0 \times 10^{-4}$ |
| Pure aluminum | $2.0 \times 10^{-7}$ | 1.1 | Poor | $3.0 \times 10^{-1}$ |
| Al-1.0% Si | $1.0 \times 10^{-7}$ | 0.9 | Poor | $1.0 \times 10^{-1}$ |
| Al-2.0% Si | $8.0 \times 10^{-8}$ | 0.8 | Poor | $2.0 \times 10^{-1}$ |
| Al-0.1% Ni-0.3% La alloy | $1.0 \times 10^{-11}$ | 0.2 | Good | $2.0 \times 10^{-4}$ |
| Al-0.1% Ni-0.1% La alloy | $2.7 \times 10^{-11}$ | 0.2 | Good | $2.0 \times 10^{-4}$ |

As is demonstrated in Table 2, the thin-film transistors using aluminum alloys comprising 0.1 atomic percent or more of nickel as source/drain electrodes have good thin-film transistor properties.

In addition, the thin-film transistors using Al-2.0 atomic percent Ni alloys further comprising 0.1 atomic percent to 2.0 atomic percent of La or 0.1 atomic percent to 1.0 atomic percent of Nd as source/drain electrodes have good thin-film transistor properties.

In contrast, the thin-film transistors using pure aluminum, Al-1 atomic percent Si, and Al-2 atomic percent Si are significantly poor in thin-film transistor properties.

What is claimed is:

1. A thin-film transistor substrate comprising a substrate, a semiconductor layer, source/drain electrodes, and a transparent pixel electrode,
   the source/drain electrodes comprising a thin film of an aluminum alloy comprising 0.1 to 6 atomic percent of nickel as an alloy element and 0.1 to 1.0 atomic percent of at least one element selected from the group consisting of Ti, V, Zr, Nb, Mo, Hf, Ta, and W as an alloy element,
   wherein the source/drain electrodes are so configured that the aluminum alloy thin film is connected to the semiconductor layer, and at least one nickel-containing compound is present at the interface between the aluminum alloy thin film and the semiconductor layer.

2. The thin-film transistor substrate of claim 1, wherein the aluminum alloy thin film has an electrical resistivity of 8 $\mu\Omega \cdot cm$ or lower.

3. The thin-film transistor substrate of claim 1, wherein the source/drain electrodes are so configured that the aluminum alloy thin film is further connected to the transparent pixel electrode.

4. The thin-film transistor substrate of claim 3, further comprising AlOx at the interface between the aluminum alloy thin film and the transparent pixel electrode, wherein "x" is the atomic ratio of oxygen and satisfies the following condition: $0 < x \leq 0.8$.

5. The thin-film transistor substrate of claim 3, further comprising a nickel-enriched layer at the interface between the aluminum alloy thin film and the transparent pixel electrode,
   wherein the nickel-enriched layer has an average nickel concentration 2 times or more higher than the average nickel concentration of the aluminum alloy.

6. The thin-film transistor substrate of claim 1, wherein the transparent pixel electrode comprises an indium-tin-oxide (ITO) or an indium zinc oxide (IZO).

7. The thin-film transistor substrate of claim 1, wherein the nickel-containing compound is at least one compound selected from the group consisting of an intermetallic compound of aluminum and nickel, and a silicide or silicon compound of nickel.

8. A thin-film transistor substrate comprising a substrate, a semiconductor layer, source/drain electrodes, and a transparent pixel electrode,
   the source/drain electrodes comprising a thin film of an aluminum alloy comprising 0.1 to 6 atomic percent of nickel as an alloy element and 0.1 to 2.0 atomic percent of at least one element selected from the group consisting of Mg, Cr, Mn, Ru, Rh, Pd, Ir, Pt, La, Gd, Tb, Dy, Ce, and Pr as an alloy element,
   wherein the source/drain electrodes are so configured that the aluminum alloy thin film is connected to the semiconductor layer, and at least one nickel-containing compound is present at the interface between the aluminum alloy thin film and the semiconductor layer.

9. A thin-film transistor substrate comprising a substrate, a semiconductor layer, source/drain electrodes, and a transparent pixel electrode,
   the source/drain electrodes comprising a thin film of an aluminum alloy comprising 0.1 to 6 atomic percent of nickel as an alloy element,
   wherein the source/drain electrodes are so configured that the aluminum alloy thin film is connected to the semiconductor layer, and a nickel-enriched layer is present at the interface between the aluminum alloy thin film and the semiconductor layer,
   the nickel-enriched layer having an average nickel concentration 2 times or more higher than the average nickel concentration of the aluminum alloy.

10. The thin-film transistor substrate of claim 9, wherein the aluminum alloy further comprises 0.1 to 1.0 atomic percent of at least one element selected from the group consisting of Ti, V, Zr, Nb, Mo, Hf Ta, and W as an alloy element.

11. The thin-film transistor substrate of claim 9, wherein the aluminum alloy further comprises 0.1 to 2.0 atomic percent of at least one element selected from the group consisting of Mg, Cr, Mn, Ru, Rh, Pd, Ir, Pt, La, Gd, Tb, Dy, Nd, Y, Ce, Pr, Co, and Fe as an alloy element.

12. The thin-film transistor substrate of claim 9, wherein the aluminum alloy thin film has an electrical resistivity of 8 μΩ·cm or lower.

13. The thin-film transistor substrate of claim 9, wherein the source/drain electrodes are so configured that the aluminum alloy thin film is further connected to the transparent pixel electrode.

14. The thin-film transistor substrate of claim 13, further comprising AlOx at the interface between the aluminum alloy thin film and the transparent pixel electrode, wherein "x" is the atomic ratio of oxygen and satisfies the following condition: $0 < x \leq 0.8$.

15. The thin-film transistor substrate of claim 13, further comprising a nickel-enriched layer at the interface between the aluminum alloy thin film and the transparent pixel electrode,
   wherein the nickel-enriched layer has an average nickel concentration 2 times or more higher than the average nickel concentration of the aluminum alloy.

16. The thin-film transistor substrate of claim 9, wherein the transparent pixel electrode comprises an indium-tin-oxide (ITO) or an indium zinc oxide (IZO).

17. A display device comprising the thin-film transistor substrate of claim 1.

18. A display device comprising the thin-film transistor substrate of claim 9.

19. A method for manufacturing the thin-film transistor substrate of claim 1, comprising:
   (a) preparing a substrate coated with a semiconductor layer;
   (b) depositing an aluminum alloy thin film comprising nickel as an alloy element on the semiconductor layer; and
   (c) depositing a silicon nitride film on the aluminum alloy thin film,
   wherein the at least one nickel-containing compound is formed between the aluminum alloy thin film and the semiconductor layer, and the step (c) comprises the step of carrying out heating at temperatures of 100° C. or higher and 300° C. or lower.

20. The method of claim 19, wherein the step (b) comprises a sputtering process.

21. A method for manufacturing the thin-film transistor substrate of claim 9, comprising:
   (a) preparing a substrate coated with a semiconductor layer;
   (b) depositing an aluminum alloy thin film comprising nickel as an alloy element on the semiconductor layer; and
   (c) depositing a silicon nitride film on the aluminum alloy thin film,
   wherein a nickel-enriched layer is formed between the aluminum alloy thin film and the semiconductor layer, and the step (c) comprises the step of carrying out heating at temperatures of 100° C. or higher and 300° C. or lower.

22. The method of claim 21, wherein the step (b) comprises a sputtering process.

* * * * *